US012811551B2

(12) United States Patent
Yoon et al.

(10) Patent No.: US 12,811,551 B2
(45) Date of Patent: Nov. 24, 2026

(54) ELECTRONIC DEVICE AND METHOD FOR PROTECTING SPEAKER USING SAME

(71) Applicant: SAMSUNG ELECTRONICS CO., LTD., Suwon-si (KR)

(72) Inventors: Gunhyuk Yoon, Suwon-si (KR); Kiwon Kim, Suwon-si (KR); Seungnam Kim, Suwon-si (KR); Byounghee Lee, Suwon-si (KR); Joonrae Cho, Suwon-si (KR); Janghoon Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 310 days.

(21) Appl. No.: 18/756,629

(22) Filed: Jun. 27, 2024

(65) Prior Publication Data

US 2025/0023532 A1 Jan. 16, 2025

Related U.S. Application Data

(63) Continuation of application No. PCT/KR2024/007615, filed on Jun. 4, 2024.

(30) Foreign Application Priority Data

Jul. 12, 2023 (KR) ........................ 10-2023-0090662
Sep. 5, 2023 (KR) ........................ 10-2023-0117966

(51) Int. Cl.
*H03F 1/52* (2006.01)
*H03G 3/30* (2006.01)
(Continued)

(52) U.S. Cl.
CPC ................. *H03G 3/30* (2013.01); *H04R 1/26* (2013.01); *H04R 29/002* (2013.01); *H03G 2201/708* (2013.01); *H04R 2430/01* (2013.01)

(58) Field of Classification Search
CPC ............. H03F 1/52; H03F 1/523; H03F 1/526
See application file for complete search history.

(56) References Cited

U.S. PATENT DOCUMENTS 10,051,370 B2 * 8/2018 Kim ......................... H04R 3/14
10,498,304 B2 12/2019 Gautama
(Continued)

FOREIGN PATENT DOCUMENTS

CN 111479198 A 7/2020
JP 2012-129952 7/2012
(Continued)

OTHER PUBLICATIONS

Search Report and Written Opinion dated Sep. 9, 2024 issued in International Patent Application No. PCT/KR2024/007615.
(Continued)

*Primary Examiner* — Henry Choe
(74) *Attorney, Agent, or Firm* — Nixon & Vanderhye, P.C.

(57) ABSTRACT

According to an embodiment, an electronic device may include: a first speaker configured to output a first audio signal corresponding to a first frequency band, a second speaker configured to output a second audio signal corresponding to a second frequency band at least partly different from the first frequency band, at least one amplifier configured to provide a first output signal for controlling output of the first speaker and a second output signal for controlling output of the second speaker, and at least one processor, comprising processing circuitry, operatively connected to the at least one amplifier. At least one processor, individually and/or collectively, may be configured to determine the first output signal, at least partly based on a first output control method; output the first audio signal, at least partly based on the first output signal, using the first speaker connected to the at least one amplifier; determine the second output
(Continued)

signal, at least partly based on a second output control method; and output the second audio signal, at least partly based on the second output signal, using the second speaker connected to the at least one amplifier.

20 Claims, 12 Drawing Sheets

(51) Int. Cl.
*H04R 1/26* (2006.01)
*H04R 29/00* (2006.01)

(56) References Cited

U.S. PATENT DOCUMENTS

| | | | |
|---|---|---|---|
| 11,144,277 | B2 | 10/2021 | Park et al. |
| 2016/0316296 | A1 | 10/2016 | Coombs |
| 2017/0127203 | A1 | 5/2017 | Ryu |
| 2018/0262825 | A1 | 9/2018 | Boyer et al. |
| 2019/0141446 | A1 | 5/2019 | Moritoki et al. |
| 2020/0288243 | A1 | 9/2020 | Choi et al. |
| 2020/0348902 | A1 | 11/2020 | Park et al. |
| 2022/0360897 | A1 | 11/2022 | Lee et al. |
| 2025/0123793 | A1* | 4/2025 | Lau ......................... G06F 3/165 |
| 2026/0156425 | A1* | 6/2026 | Yoon ........................ H04R 3/04 |

FOREIGN PATENT DOCUMENTS

| | | | |
|---|---|---|---|
| JP | 2021097292 | A | 6/2021 |
| KR | 10-2019-0043052 | | 4/2019 |
| KR | 102028538 | B1 | 10/2019 |
| KR | 10-2393364 | | 5/2022 |
| KR | 10-2419512 | | 7/2022 |
| KR | 10-2022-0125026 | | 9/2022 |
| KR | 10-2022-0152831 | | 11/2022 |

OTHER PUBLICATIONS

Extended European Search Report dated Jul. 10, 2026 issued in European Patent Application No. 24839912.3.

* cited by examiner

ELECTRONIC DEVICE AND METHOD FOR PROTECTING SPEAKER USING SAME

CROSS-REFERENCE TO RELATED APPLICATIONS

This application is a continuation of International Application No. PCT/KR2024/007615 designating the United States, filed on Jun. 4, 2024, in the Korean Intellectual Property Receiving Office and claiming priority to Korean Patent Application Nos. 10-2023-0090662, filed on Jul. 12, 2023, and 10-2023-0117966, filed on Sep. 5, 2023, in the Korean Intellectual Property Office, the disclosures of each of which are incorporated by reference herein in their entireties.

BACKGROUND

Field

The disclosure relates to an electronic device and a method for protecting a speaker using the same.

Description of Related Art

With the advancement of digital technology, various types of electronic devices, such as a portable terminal, a personal digital assistant (PDA), an electronic organizer, a smartphone, a tablet personal computer (PC), a wearable device, or an artificial intelligence speaker (AI speaker), are supplied. Various electronic devices may include at least one speaker, and may provide various audio signals (e.g., a voice signal) to a user using the at least one speaker. For example, the various electronic devices may play music, or may output an audio signal of multimedia content through the at least one speaker.

When outputting an audio signal through a speaker, an electronic device may identify or predict the temperature of the speaker, and may provide a method of adjusting a voltage supplied to the speaker so that the temperature of the speaker is maintained at a certain temperature value or lower.

The above information is presented as related art to assist with an understanding of the disclosure. No determination has been made, and no assertion is made, as to whether any of the above might be applicable as prior art with regard to the disclosure.

In a case where an electronic device outputs an audio signal through a speaker, when a voltage supplied to the speaker exceeds a configured voltage (e.g., a rated voltage), the temperature of the speaker may be increased. For example, when the temperature of the speaker is increased, a component included in the speaker may be at least partly deformed. Deformation of the component may reduce a quality of the audio signal output through the speaker. In a normal electronic device, one amplifier may be electrically or operatively connected to one speaker. For example, a first amplifier may be connected to a first speaker, and the electronic device may measure a temperature of the first speaker, based on the first amplifier. A second amplifier may be connected to a second speaker, and the electronic device may measure a temperature of the second speaker, based on the second amplifier.

SUMMARY

Embodiments of the disclosure provide an electronic device with a structure in which a plurality of speakers (e.g., a first speaker or a second speaker) are connected to one amplifier, and may identify a temperature of each of the plurality of speakers through the one amplifier.

Embodiments of the disclosure provide an electronic device that may identify a situation where the temperature exceeds a temperature configured for each of the plurality of speakers, and may provide a method of blocking a voltage supplied to the speaker or adjusting the voltage in response to the situation.

Technical aspects to be achieved in the disclosure are not limited to the technical aspects mentioned above, and other technical aspects not mentioned will be clearly understood by those skilled in the art from the following description.

According to an example embodiment, an electronic device may include: a first speaker configured to output a first audio signal corresponding to a first frequency band, a second speaker configured to output a second audio signal corresponding to a second frequency band at least partly different from the first frequency band, at least one amplifier configured to provide a first output signal for controlling output of the first speaker and a second output signal for controlling output of the second speaker, and at least one processor, comprising processing circuitry, operatively connected to the at least one amplifier, wherein at least one processor, individually and/or collectively, may be configured to: determine the first output signal, at least partly based on a first output control method; output the first audio signal, at least partly based on the first output signal, using the first speaker connected to the at least one amplifier; determine the second output signal, at least partly based on a second output control method; and output the second audio signal, at least partly based on the second output signal, using the second speaker connected to the at least one amplifier.

According to an example embodiment, a speaker module may include: a first speaker configured to output a first audio signal corresponding to a first frequency band, a second speaker configured to output a second audio signal corresponding to a second frequency band at least partly different from the first frequency band, at least one amplifier configured to provide a first output signal for controlling output of the first speaker and a second output signal for controlling output of the second speaker and to provide an amplified signal to the first speaker and second speaker, a band-pass filter disposed between the at least one amplifier and the second speaker, and a speaker protection circuit operatively connected to the at least one amplifier. The speaker protection circuit may be configured such that the first output signal is determined at least partly based on a first output control method. The speaker protection circuit may be configured such that the first audio signal is output at least partly based on the first output signal using the first speaker connected to the at least one amplifier. The speaker protection circuit may be configured such that the second output signal is determined at least partly based on a second output control method different from the first output control method. The speaker protection circuit may be configured such that the second audio signal is output at least partly based on the second output signal, using the second speaker connected to the at least one amplifier.

According to an example embodiment, a method of operating an electronic device may include: determining a first output signal for at least one amplifier included in the electronic device, at least partly based on a first output control method, using at least one processor included in the electronic device, outputting a first audio signal corresponding to a first frequency band, at least partly based on the first output signal, using a first speaker connected to the at least one amplifier, determining a second output signal for the at least one amplifier, at least partly based on a second output control method, using at least one processor, and outputting a second audio signal corresponding to a second frequency band at least partly different from the first frequency band, at least partly based on the second output signal, using a second speaker connected to the at least one amplifier.

According to an example embodiment, a non-transitory computer-readable storage medium (or a computer program product) that has stored thereon one or more programs may be described. According to an example embodiment, the one or more programs may include instructions that, when executed by at least one processor, individually and/or collectively, of an electronic device, cause the electronic device to perform operations comprising: determining a first output signal for at least one amplifier included in the electronic device, at least partly based on a first output control method, outputting a first audio signal corresponding to a first frequency band, at least partly based on the first output signal, using a first speaker connected to the at least one amplifier, determining a second output signal for the at least one amplifier, at least partly based on a second output control method, and outputting a second audio signal corresponding to a second frequency band at least partly different from the first frequency band, at least partly based on the second output signal, using a second speaker connected to the at least one amplifier.

According to an example embodiment, an electronic device may identify a temperature of each of a plurality of speakers using one amplifier electrically connected to the plurality of speakers. For example, the electronic device may identify a first temperature of a first speaker, based on a signal reflected by the first speaker. In another example, the electronic device may identify a second temperature of a second speaker, based on a voltage supplied to the second speaker, based on a second frequency band corresponding to the second speaker.

According to an example embodiment, when the first temperature exceeds a first threshold value configured for the first speaker, the electronic device may adjust a voltage supplied to the first speaker. When the second temperature exceeds a second threshold value configured for the second speaker, the electronic device may adjust the voltage supplied to the second speaker. According to an example embodiment, the electronic device may adjust a first voltage supplied to the first speaker, based on a first frequency band, and may adjust a second voltage supplied to the second speaker, based on the second frequency band.

According to an example embodiment, the electronic device may measure the temperature of each of the plurality of speakers using the one amplifier. For example, as the number of amplifiers disposed in an internal space of the electronic device is reduced, a mounting space for mounting other components may be secured, and current consumption due to an operation of the amplifiers may be reduced. When the number of amplifiers is reduced, material costs for designing the electronic device may be reduced. In another example, operations of synchronizing the plurality of amplifiers may be reduced.

According to an example embodiment, the electronic device may identify the temperature of each of the plurality of speakers using the one amplifier, and may improve efficiency due to protection of the speakers.

Effects obtainable from the disclosure are not limited to the effects mentioned above, and other effects not mentioned will be clearly understood by those skilled in the art from the following description.

BRIEF DESCRIPTION OF THE DRAWINGS

In describing the drawings, the same or like reference numerals may be used to refer to the same or like elements. Further, the above and other aspects, features and advantages of certain embodiments of the present disclosure will be more apparent from the following detailed description, taken in conjunction with the accompanying drawings, in which.

DETAILED DESCRIPTION

Figure 1:
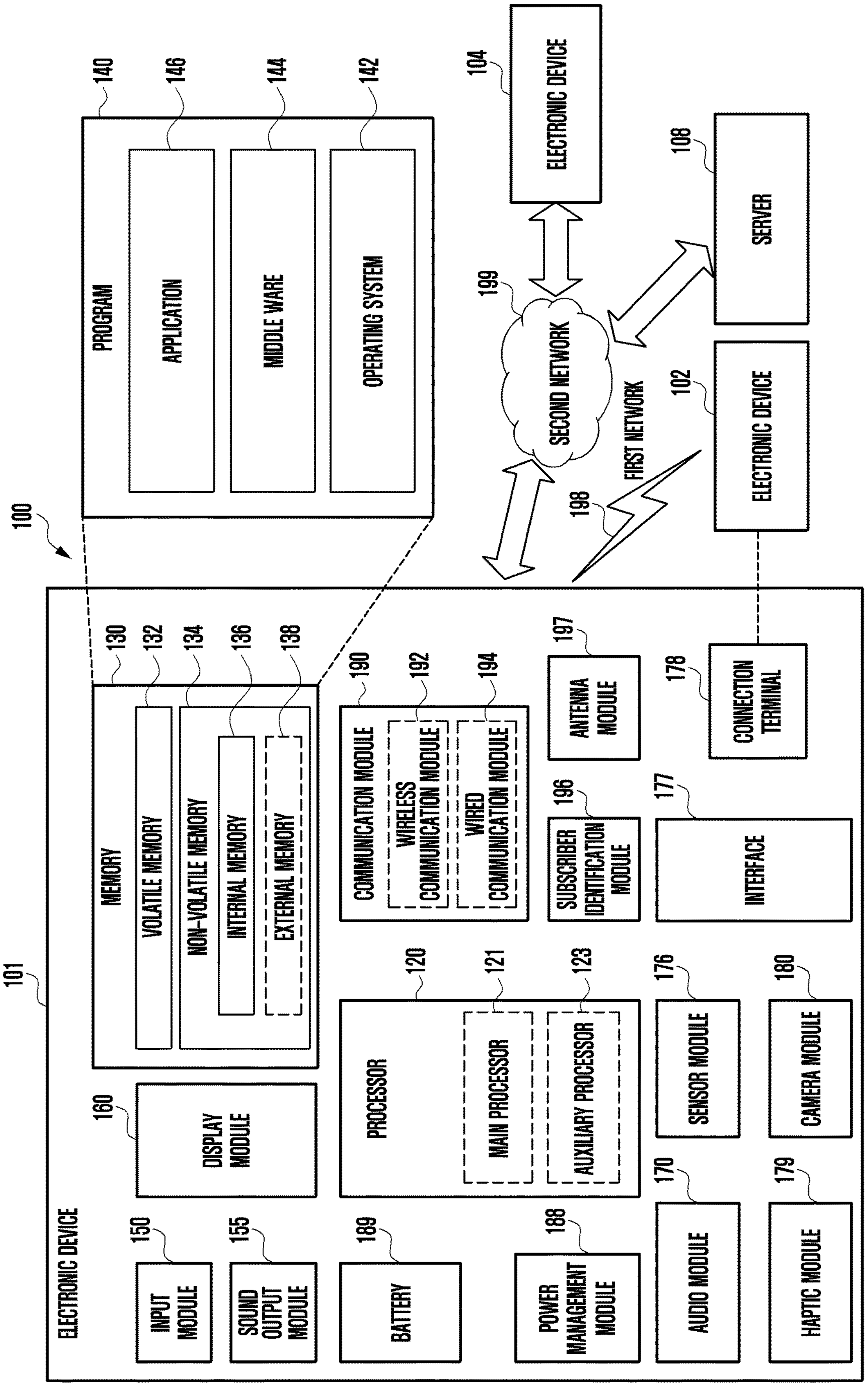
FIG. 1 is a block diagram illustrating an example electronic device in a network environment according to various embodiments.

Hereinafter, various example embodiments of the disclosure will be described in greater detail with reference to the accompanying drawings. However, the disclosure is not limited to the various example embodiments disclosed herein and can be realized in various other ways. In describing the drawings, the same or like reference numerals may be used to refer to the same or like elements. In the drawings and related descriptions, descriptions of well-known functions or components may be omitted for clarity and conciseness.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band. For example, the plurality of antennas may include a patch array antenna and/or a dipole array antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
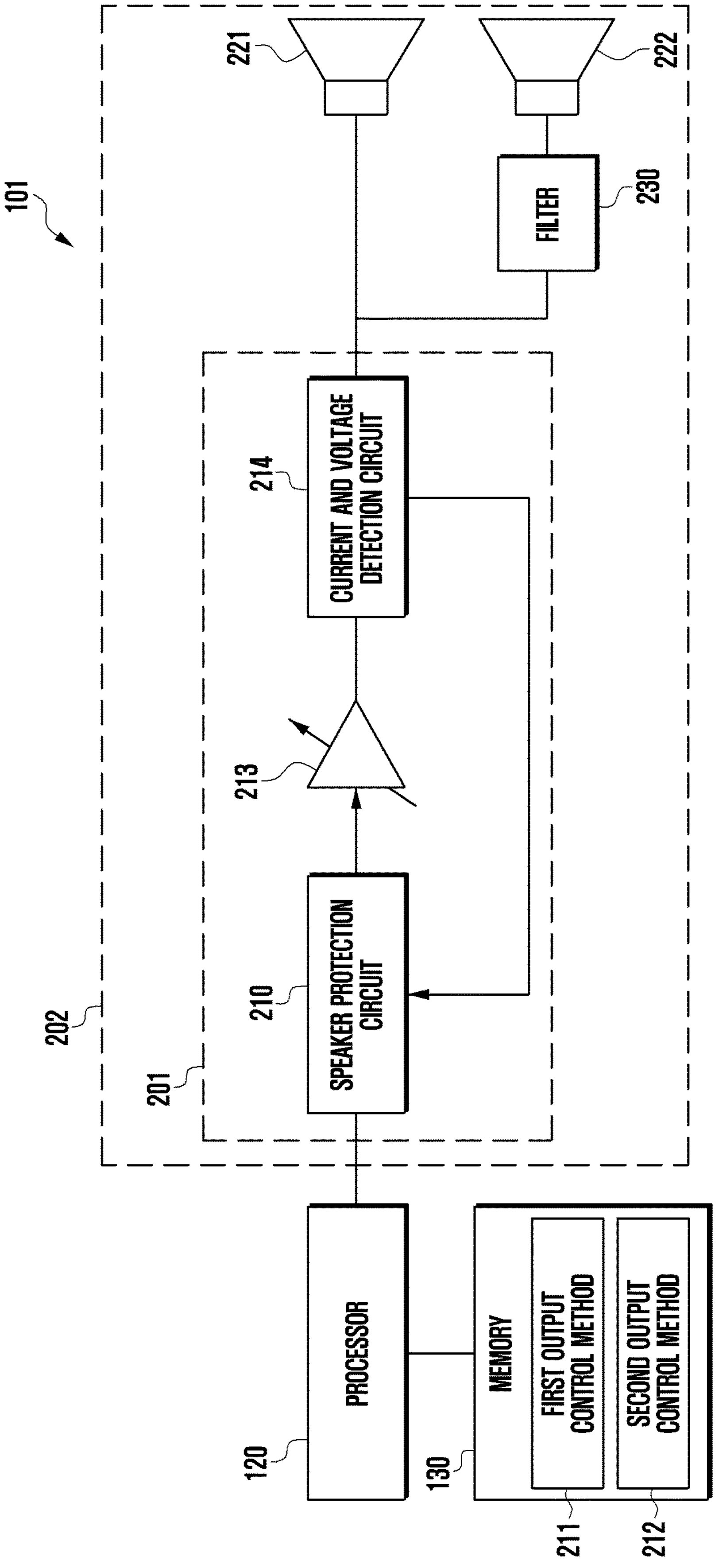
FIG. 2 is a block diagram illustrating an example configuration of an electronic device according to various embodiments.

FIG. 2 is a block diagram illustrating an example configuration of an electronic device according to various embodiments.

The electronic device 101 of FIG. 2 (e.g., the electronic device 101 of FIG. 1) may be at least partly similar to the electronic device 101 of FIG. 1, or may further include various embodiments of the electronic device.

According to an embodiment, in outputting an audio signal using a plurality of speakers (e.g., a first speaker 221 and a second speaker 222), the electronic device 101 may identify a temperature of each of the plurality of speakers, based on one amplifier. According to an embodiment, the electronic device 101 may identify a first temperature of the first speaker 221, based on a signal reflected by the first speaker 221, and may adjust a first voltage supplied to the first speaker 221 in response to the first temperature exceeding to a configured first threshold value. According to an embodiment, the electronic device 101 may identify (e.g., predict) a second temperature of the second speaker 222, based on an input signal supplied to the second speaker 222, and may adjust a second voltage supplied to the second speaker 222 in response to the second temperature exceeding a configured second threshold value.

According to an embodiment, the electronic device 101 may identify the first temperature of the first speaker 221 and the second temperature of the second speaker 222 using one amplifier. According to an embodiment, as the number of amplifiers included in the electronic device 101 is reduced, a cost of designing the electronic device 101 may be reduced, and current consumption due to an operation of the amplifiers may be reduced. A mounting space may be secured by omitting an amplifier. As operations of synchronizing a plurality of amplifiers is reduced, efficiency in outputting an audio signal may be improved.

According to an embodiment, the electronic device 101 may identify the temperature of each of the plurality of speakers (e.g., the first speaker 221 or the second speaker 222) using an audio circuit 201 including one amplifier (e.g., the amplifier 213 of FIG. 2). The electronic device 101 may separately adjust a voltage supplied to each speaker to prevent and/or reduce each speaker from being damaged by a temperature change. For example, the electronic device 101 may determine a first output signal supplied to the first speaker 221, at least partly based on a first output control method 211. For example, the electronic device 101 may determine a second output signal supplied to the second speaker 222, at least partly based on a second output control method 212.

Referring to FIG. 2, the electronic device 101 may include a processor (e.g., including processing circuitry) (e.g., the processor 120 of FIG. 1), a memory (e.g., the memory 130 of FIG. 1), the audio circuit 201, and/or the plurality of speakers (e.g., the first speaker 221 or the second speaker 222). For example, the processor 120 of the electronic device 101 may be operatively or electrically connected to the memory 130 and the audio circuit 201.

According to an embodiment, a speaker module 202 may include the first speaker 221, the second speaker 222, or the audio circuit 201. The audio circuit 201 may include a speaker protection circuit 210, at least one amplifier 213, and/or a current and voltage detection circuit 214. In an embodiment, the speaker module 202 and the audio circuit 201 may be included as a single component in the electronic device 101. In an embodiment, some components included in the speaker module 202 and the audio circuit 201 may be separately included in the electronic device 101. In the following description, the speaker module 202 or the audio circuit 201 (e.g., the speaker protection circuit 210) included in the speaker module 202 may configure an operation of the electronic device 101. At least some of the following operations of the processor 120 may be performed by the speaker module 202 or the audio circuit 201 (e.g., the speaker protection circuit 210).

According to an embodiment, the processor 120 of the electronic device 101 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may, for example, execute a program (e.g., the program 140 of FIG. 1) stored in the memory 130 to control at least one other component (e.g., a hardware or software component), and may perform various types of data processing or operations. For example, the processor 120 may supply a voltage to the first speaker 221 and the second speaker 222, and may output an audio signal through the first speaker 221 and the second speaker 222. The processor 120 may identify the temperature of each of the plurality of speakers (e.g., the first speaker 221 or the second speaker 222) using at least one of the first output control method 211 and the second output control method 212, based on the speaker protection circuit 210. According to an embodiment, the processor 120 may determine the first output signal supplied to the first speaker 221, at least partly based on the first output control method 211, and may determine the second output signal supplied to the second speaker 222, at least partly based on the second output control method 212.

According to an embodiment, a first threshold voltage configured based on the first speaker 221 and a second threshold voltage configured based on the second speaker 222 may be stored in the memory 130. For example, the processor 120 may supply the first voltage to the first speaker 221, based on the first threshold voltage, and may supply the second voltage to the second speaker 222, based on the second threshold voltage.

According to an embodiment, the audio circuit 201 may include the speaker protection circuit 210 to prevent and/or reduce the speaker from being damaged by a temperature changes, the amplifier 213 (e.g., at least one amplifier) to at least partly amplify a voltage supplied to the speaker, and a detection circuit (e.g., the current and voltage detection circuit 214) to detect an electric current (I) and a voltage (V) of a signal reflected by the speaker.

According to an embodiment, the speaker protection circuit 210 may perform a temperature checking method supporting the first output control method 211 and/or a temperature checking method supporting the second output control method 212. For example, the first output control method 211 (e.g., a temperature calculation method based on a current value (I) and a voltage value (V) obtained based on a signal reflected by a speaker) may include a method of identifying a current (I) and a voltage (V) according to a reflected signal, based on the signal reflected by the speaker, and calculating the temperature of the speaker, based on the current (I) and voltage (V). For example, the processor 120 may identify the first temperature of the first speaker 221, based on the first output control method 211.

According to an embodiment, the second output control method 212 (e.g., a temperature prediction method based on an input signal) may include a method of predicting the temperature of the speaker, based on an input signal supplied from the processor 120 to the audio circuit 201. For example, the processor 120 may predict the second temperature of the second speaker 222, based on the second output control method 212.

According to an embodiment, the one amplifier 213 may perform an operation of amplifying a voltage (e.g., power) supplied to each of the plurality of speakers. For example, when outputting a first audio signal for the first speaker 221, based on a first frequency band, the processor 120 may supply the first voltage amplified by the amplifier 213 (e.g., at least one amplifier) to the first speaker 221. For example, when outputting a second audio signal for the second speaker 222, based on a second frequency band, the processor 120 may supply the second voltage amplified by the amplifier 213 (e.g., at least one amplifier) to the second speaker 222. According to an embodiment, the processor 120 may at least partly adjust a level of a supplied voltage, based on a specific frequency band.

According to an embodiment, the current and voltage detection circuit 214 may obtain a current value (I) and a voltage value (V), based on a signal reflected by a speaker. For example, in a state of supplying a voltage to the first speaker 221, the processor 120 may supply a first amplifier (AMP) signal (e.g., an AMP pilot tone signal, a sine signal of about 20 Hz or less) for measuring the temperature of the first speaker 221 to the first speaker 221. For example, the first speaker 221 may at least partly reflect the supplied first AMP signal. The processor 120 may identify a current value (I) and a voltage value (V) corresponding to the first AMP signal, based on a signal (e.g., a reflected AMP signal) into which the first AMP signal is reflected by the first speaker 211. The processor 120 may identify the current value (I) and voltage value (V) corresponding to the first AMP signal using the current and voltage detection circuit 214.

According to an embodiment, the speaker protection circuit 210 may calculate the current value (I) and the voltage value (V) corresponding to the first AMP signal (e.g., the AMP signal supplied to measure the temperature of the first speaker 221), based on the signal (e.g., the reflected AMP signal) reflected by the first speaker 221. The speaker protection circuit 120 may provide the calculated current value (I) and voltage value (V) to the processor 120.

According to an embodiment, the processor 120 may calculate the first temperature of the first speaker 221, based on the first output control method 211 (e.g., the temperature calculation method based on the obtained current value (I) and voltage value (V) by obtaining the current value (I) and the voltage value (V), based on the signal reflected by the speaker).

According to an embodiment, the first AMP signal (e.g., the AMP pilot tone signal, the sine signal of about 20 Hz or less) may not be transmitted to the second speaker 222 due to a band-pass filter 230. For example, the first AMP signal may be transmitted only to the first speaker 221, and the reflected AMP signal may refer to the signal reflected by the first speaker 221. The processor 120 may identify the current value (I) and the voltage value (V) corresponding to the first speaker 221, based on the reflected AMP signal. The processor 120 may calculate the first temperature of the first speaker 221 according to the current value (I) and the voltage value (V), based on the first output control method 211 (e.g., a VI method).

According to an embodiment, the first speaker 221 may include a woofer speaker, and may output an audio signal based on the first frequency band (e.g., a low sound range or a mid-sound range). For example, the second speaker 222 may include a tweeter speaker, and may output an audio signal based on a second frequency band (e.g., a high sound range). For example, the first frequency band may include frequency bands corresponding to a low sound range and a mid-sound range, compared to the second frequency band.

The second frequency band may include a frequency band corresponding to a high sound range, compared to the first frequency band.

According to an embodiment, the first speaker 221 may output an audio signal, based on a low-sound or mid-sound frequency band that is below a specific frequency band, and the second speaker 222 may output an audio signal, based on a high-sound frequency band that is the specific frequency band or higher. For example, the first speaker 221 and the second speaker 222 may output audio signals partly in the same frequency band.

According to an embodiment, the band-pass filter 230 may include at least one passive element (e.g., a capacitor or an inductor) to selectively process only a signal corresponding to a specific frequency band. For example, the band-pass filter 230 may be disposed between the audio circuit 201 and the second speaker 222, and may selectively process the high-sound frequency band supported by the second speaker 222. A signal in the high-sound frequency band may pass through the band-pass filter 230, and be transmitted to the second speaker 222. For example, the band-pass filter 230 may include a DC block capacitor (e.g., a DC blocking capacitor). For example, the processor 120 supplies the first AMP signal (e.g., the AMP pilot tone signal, the sine signal of about 20 Hz or less) to the speaker to measure the temperature of the speaker, but the first AMP signal may be blocked by the band-pass filter 230. The first AMP signal may not be transmitted to the second speaker 222. According to an embodiment, the band-pass filter 230 is not limited to selection of only the high-sound frequency band. The band-pass filter 230 may select a signal based on a configured specific frequency band.

According to an embodiment, the processor 120 of the electronic device 101 may supply the first AMP signal (e.g., the AMP pilot tone signal, the sine signal of about 20 Hz or less) to the first speaker 221 through the audio circuit 201, and may obtain the signal (e.g., the reflected AMP signal) into which the first AMP signal is reflected by the first speaker 221. The processor 120 may identify the current value (I) and the voltage value (V) of the reflected AMP signal, based on the current and voltage detection circuit 214, and may apply the current value (I) and the voltage value (V) to a first circuit supporting the first output control method 211. The processor 120 may calculate a resistance value (R), based on the current value (I) and the voltage value (V), and may measure the first temperature of the first speaker 221, based on the resistance value. The processor 120 may identify the first temperature of the first speaker 221, based on the reflected AMP signal.

According to an embodiment, the processor 120 of the electronic device 101 may supply an input signal to the second speaker 222 through the audio circuit 201. For example, the input signal may be selected as a signal corresponding to a specific frequency band (e.g., the high-sound frequency band) through the band-pass filter 230, and may be transmitted to the second speaker 222. The processor 120 may predict the second temperature of the second speaker 222, based on the input signal supplied to the second speaker 222. For example, the processor 120 may apply the input signal processed by the band-pass filter 230 to a feedforward method (e.g., a method of predicting a temperature of a speaker to which an input signal is supplied by analyzing a level of the input signal, the second output control method 212), and may predict the second temperature of the second speaker 222, based on the input signal. For example, the processor 120 may identify the second temperature of the second speaker 222, based on the feedforward method (e.g., the second output control method 212).

According to an embodiment, the processor 120 of the electronic device 101 may supply an input signal to the first speaker 221 through the audio circuit 201, at least partly based on the second output control method 212. The processor 120 may predict the first temperature of the first speaker 221, based on the input signal supplied to the first speaker 221. For example, the processor 120 may apply the input signal supplied to the first speaker 221 to the feedforward method (e.g., the second output control method 212), and may predict the first temperature of the first speaker 221, based on the input signal.

According to an embodiment, the processor 120 of the electronic device 101 may identify a rated voltage for the first speaker 221 and the second speaker 222 stored in the memory 130, and may supply a voltage to at least one of the first speaker 221 and the second speaker 222, based on the identified rated voltage. For example, the processor 120 may supply a voltage to the first speaker 221 under a condition that the voltage does not exceed a first rated voltage corresponding to the first speaker 221. When the voltage that does not exceed the first rated voltage is supplied to the first speaker 221, the first speaker 221 may maintain a temperature below a certain level. The processor 120 may prevent and/or reduce damage to the first speaker 221 due to a temperature change by supplying the first speaker 221 with a relatively lower voltage than the first rated voltage of the first speaker 221.

According to an embodiment, the electronic device 101 may identify the voltage supplied to the first speaker 221, and may stop measuring the temperature of the first speaker 221 when the identified voltage does not exceed the first rated voltage configured corresponding to the first speaker 221. For example, the electronic device 101 may not supply the first AMP signal (e.g., the sine signal of about 20 Hz or less) for measuring the temperature of the first speaker 221 to the first speaker 221. For example, when the voltage supplied to the first speaker 221 is less than the first rated voltage, the temperature of the first speaker 221 may be maintained below the certain level. According to an embodiment, the processor 120 may separately identify a voltage supplied to the plurality of speakers (e.g., the first speaker 221 and the second speaker 222), and may identify a rated voltage for each speaker. The processor 120 may identify a speaker being supplied with a voltage exceeding a rated voltage, and may perform an operation of measuring a temperature of the identified speaker.

According to an embodiment, an electronic device (e.g., the electronic device 101 of FIG. 1 and FIG. 2) may include: a first speaker (e.g., the first speaker 221 of FIG. 2) configured to output a first audio signal corresponding to a first frequency band (e.g., a low-sound frequency band and/or a mid-sound frequency band), a second speaker (e.g., the second speaker 222 of FIG. 2) configured to output a second audio signal corresponding to a second frequency band (e.g., a high-sound frequency band) at least partly different from the first frequency band, at least one amplifier (e.g., the amplifier 213 of FIG. 2) configured to provide a first output signal for controlling output of the first speaker and a second output signal for controlling output of the second speaker, and at least one processor, comprising processing circuitry (e.g., the processor 220 of FIG. 1 and FIG. 2), operatively connected to the at least one amplifier, wherein at least one processor, individually and/or collectively, may be configured to: determine the first output signal, at least partly based on a first output control method (e.g., the first output control method 211 of FIG. 2); output the first audio signal, at least partly based on the first output signal, using the first speaker connected to the at least one amplifier; determine the second output signal, at least partly based on a second output control method (e.g., the second output control method 212 of FIG. 2); and output the second audio signal, at least partly based on the second output signal, using the second speaker connected to the at least one amplifier.

According to an example embodiment, at least one processor, individually and/or collectively, may be configured to: determine the first output signal so that the first speaker is not overheated to a first specified temperature or higher based on the first audio signal being output through the first speaker according to the first output signal; and determine the second output signal so that the second speaker is not overheated to a second specified temperature or higher based on the second audio signal being output through the second speaker according to the second output signal.

According to an example embodiment, at least one processor, individually and/or collectively, may be configured to: use one of a plurality of output control methods including at least two or more of a voltage or current-based method, an audio signal-based method, or a rated voltage-based method as the first output control method and another of the plurality of output control methods as the second output control method.

According to an example embodiment, at least one processor, individually and/or collectively, may be configured to: determine the first output signal, at least partly based on a voltage or a current of the first speaker obtained based on audio being output through the first speaker according to the voltage or current-based method; and determine the second output signal, at least partly based on a characteristic of a signal corresponding to audio content to be output through the second speaker according to the audio signal-based method.

According to an example embodiment, at least one processor, individually and/or collectively, may be configured to: obtain the voltage or the current, at least partly based on a signal provided from the at least one amplifier and reflected by the first speaker. The electronic device according to an example embodiment may further include a band-pass filter disposed between the at least one amplifier and the second speaker.

According to an example embodiment, the second output control method may include a method of protecting the second speaker so that the second speaker is not overheated to a second specified temperature or higher, based on the second output signal supplied to the second speaker.

According to an example embodiment, the second output control method may include a method of supplying a voltage lower than a rated voltage of the second speaker to the second speaker.

According to an example embodiment, the first output control method may include a method of protecting the first speaker so that first second speaker is not overheated to a first specified temperature or higher, based on the first output signal supplied to the first speaker. According to an example embodiment, the second output control method may include a method of supplying a voltage lower than a rated voltage of the second speaker to the second speaker.

According to an example embodiment, the first output control method may include a method of supplying a voltage lower than a rated voltage of the first speaker to the first speaker. According to an example embodiment, the second output control method may include a method of protecting the second speaker so that the second speaker is not overheated to a second specified temperature or higher, based on the second output signal supplied to the second speaker.

According to an example embodiment, the voltage or current-based method may include a method of predicting a temperature of the first speaker, based on a signal reflected by the first speaker.

According to an example embodiment, the audio signal-based method may include a method of predicting a temperature of the second speaker, based on an input signal supplied to the second speaker.

According to an example embodiment, the first output control method and the second output control method may include an audio signal-based method.

According to an example embodiment, the electronic device may further include a third speaker operatively connected to the at least one amplifier and configured to output an audio signal based on a third frequency band and a band-pass filter disposed between the at least one amplifier and the third speaker.

According to an example embodiment, the electronic device may further include a third speaker operatively connected to the at least one amplifier and configured to output an audio signal based on a third frequency. In the electronic device according to an example embodiment, no band-pass filter may be disposed between the at least one amplifier and the third speaker.

According to an example embodiment, a speaker module (e.g., the speaker module 202 of FIG. 2) may include: a first speaker configured to output a first audio signal corresponding to a first frequency band, a second speaker configured to output a second audio signal corresponding to a second frequency band at least partly different from the first frequency band, at least one amplifier configured to provide a first output signal for controlling output of the first speaker and a second output signal for controlling output of the second speaker and to provide an amplified signal to the first speaker and second speaker, a band-pass filter disposed between the at least one amplifier and the second speaker, and a speaker protection circuit operatively connected to the at least one amplifier. The speaker protection circuit may be configured such that the first output signal is determined at least partly based on a first output control method. The speaker protection circuit may be configured such that the first audio signal is output at least partly based on the first output signal using the first speaker connected to the at least one amplifier. The speaker protection circuit may be configured such that the second output signal is determined at least partly based on a second output control method different from the first output control method. The speaker protection circuit may be configured such that the second audio signal is output at least partly based on the second output signal, using the second speaker connected to the at least one amplifier.

According to an example embodiment, the first output signal may be configured such that the first speaker is not overheated to a first specified temperature or higher based on the first audio signal being output through the first speaker. The second output signal may be configured such that the second speaker is not overheated to a second specified temperature or higher based on the second audio signal being output through the second speaker.

According to an example embodiment, the first output control method may include one of a plurality of output control methods including at least two or more of a voltage or current-based method, an audio signal-based method, or a rated voltage-based method. The second output control method may include another of the plurality of output control methods.

According to an example embodiment, the first output signal may be determined at least partly based on a voltage or a current of the first speaker obtained based on audio being output through the first speaker according to the voltage or current-based method. The second output signal may be determined at least partly based on a characteristic of a signal corresponding to audio content to be output through the second speaker according to the audio signal-based method.

Figure 3A:
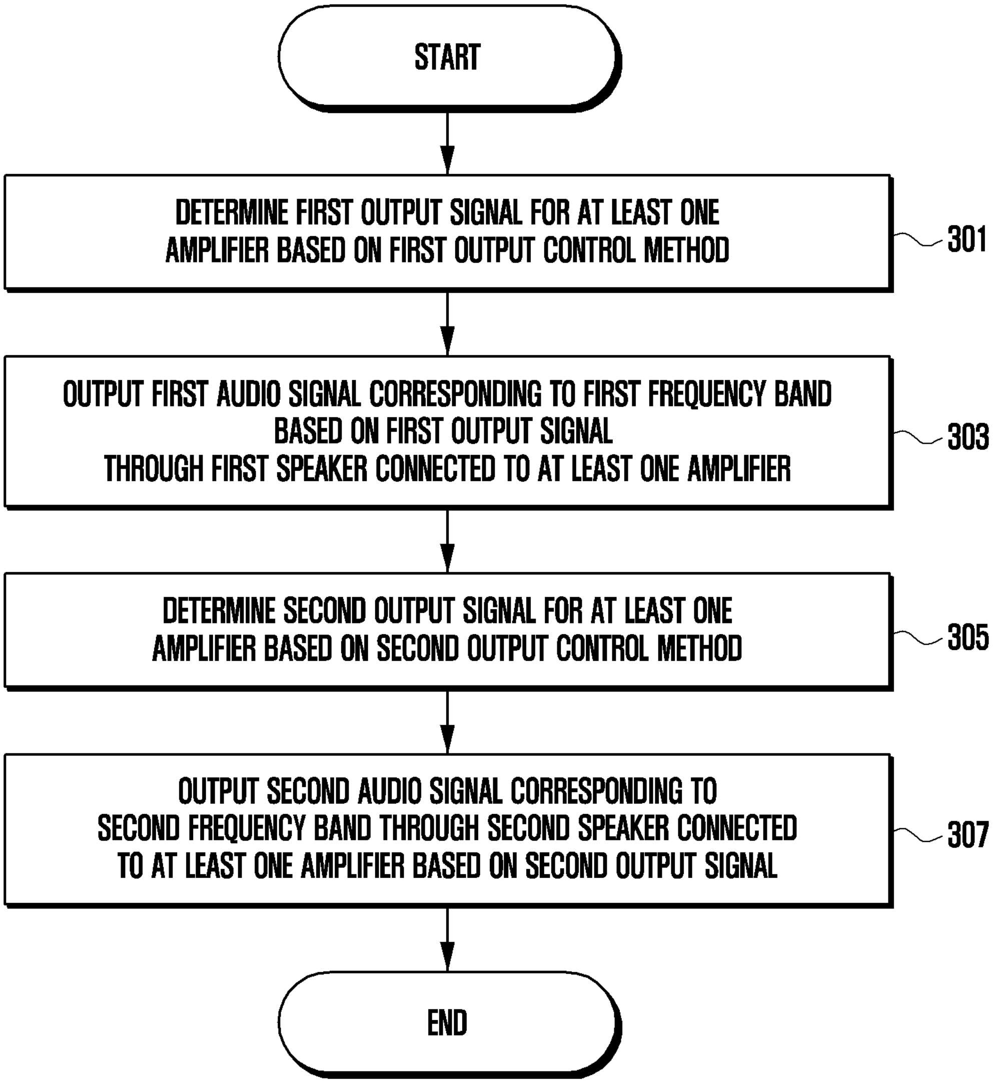
FIG. 3A is a flowchart illustrating a first example method of protecting a speaker according to various embodiments.
Figure 3B:
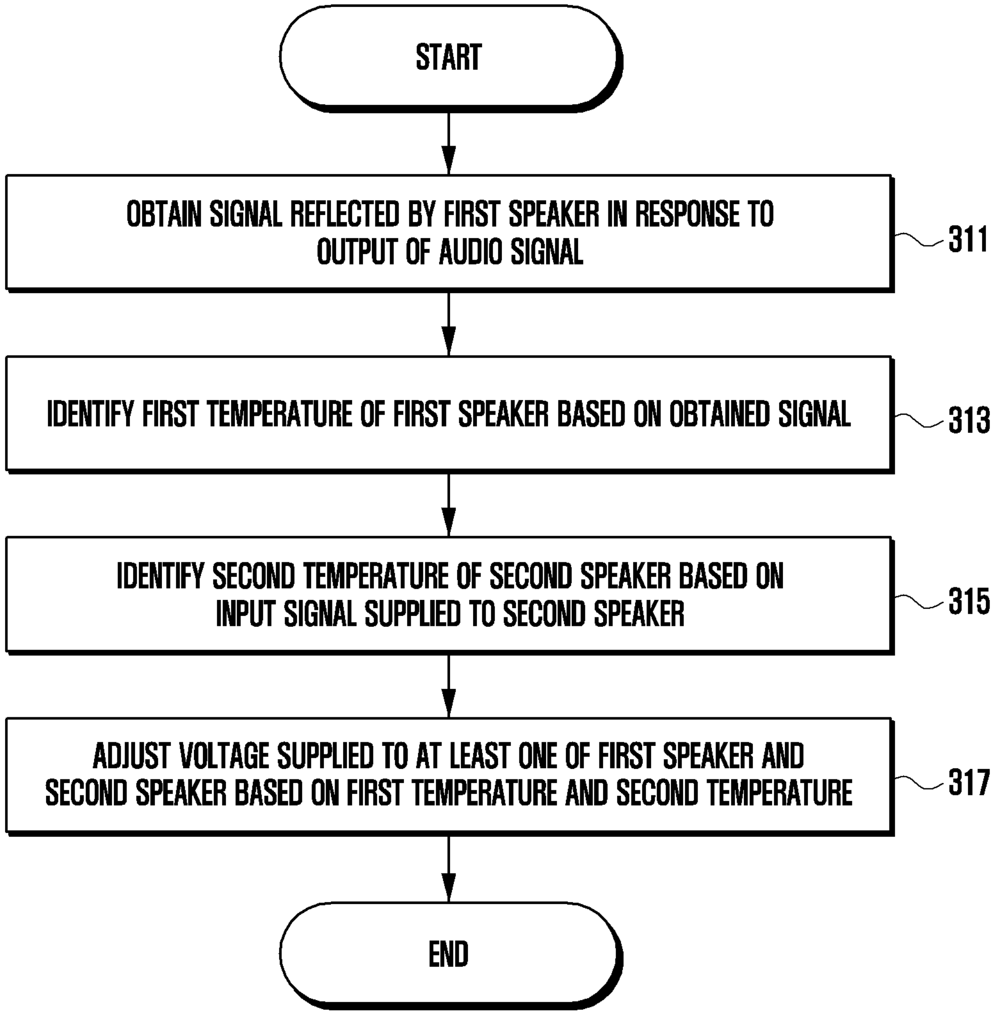
FIG. 3B is a flowchart illustrating an example process of performing the first method according to various embodiments.

FIG. 3A is a flowchart illustrating a first example method of protecting a speaker according to various embodiments. FIG. 3B is a flowchart illustrating an example process of performing the first method in detail according to various embodiments.

In the following example embodiments, operations may be sequentially performed, but are not necessarily performed sequentially. For example, the operations may be performed in a different order, or at least two operations may be performed in parallel.

According to an embodiment, operation 301 to operation 307 of FIG. 3A, and operation 311 to operation 317 of FIG. 3B may be understood as being performed by at least one processor (e.g., the processor 120 of FIG. 1 and FIG. 2) of an electronic device (e.g., the electronic device 101 of FIG. 1 and FIG. 2).

The electronic device 101 of FIG. 3A and FIG. 3B may be at least partly similar to the electronic device 101 of FIG. 1 and FIG. 2, or may further include various embodiments of an electronic device. For example, the electronic device 101 may output an audio signal (e.g., a first audio signal through a first speaker 221 or a second audio signal through a second speaker 222) using a plurality of speakers (e.g., the first speaker 221 or the second speaker 222). For example, the plurality of speakers may be in a state of being electrically or operatively connected to one amplifier (e.g., the at least one amplifier 213 of FIG. 2). The electronic device 101 may identify a first temperature of the first speaker 221 and a second temperature of the second speaker 222 using the one amplifier.

According to an embodiment, as the number of amplifiers included in the electronic device 101 is reduced, a cost of designing the electronic device 101 may be reduced, and current consumption due to an operation of the amplifiers may be reduced. For example, a mounting space may be secured by omitting an amplifier. According to an embodiment, as operations of synchronizing a plurality of amplifiers is reduced, efficiency in outputting an audio signal may be improved.

Referring to FIG. 3A, in operation 301, the processor 120 of the electronic device 101 may determine a first output signal for the at least one amplifier, based on a first output control method. For example, the processor 120 may determine the first output signal so that the temperature of the first speaker 221 does not exceed the configured first temperature in a situation where the first output signal is supplied to the first speaker 221. According to an embodiment, the first output signal may include a control signal to control output of the first speaker 221 (e.g., output of the first audio signal).

In operation 303, the processor 120 may output the first audio signal corresponding to a first frequency band through the first speaker 221 connected to the at least one amplifier, based on the first output signal. For example, the first speaker 221 may include a speaker configured to output the first audio signal corresponding to the first frequency band when the first output signal is supplied. According to an embodiment, the first speaker 221 may be configured not to exceed the configured first temperature when the first audio signal is output by supplying the first output signal.

In operation 305, the processor 120 may determine a second output signal for the at least one amplifier, based on a second output control method. For example, the processor 120 may determine the second output signal so that the temperature of the second speaker 222 does not exceed the configured second temperature in a situation where the second output signal is supplied to the second speaker 222. According to an embodiment, the second output signal may include a control signal to control output of the second speaker 222 (e.g., output of the second audio signal).

In operation 307, the processor 120 may output the second audio signal corresponding to a second frequency band through the second speaker 222 connected to the at least one amplifier, based on the second output signal. For example, the second speaker 222 may include a speaker configured to output the second audio signal corresponding to the second frequency band when the second output signal is supplied. According to an embodiment, the second speaker 222 may be configured not to exceed the configured second temperature when the second audio signal is output by supplying the second output signal.

Referring to FIG. 3B, in operation 311, the processor 120 of the electronic device 101 may obtain a signal reflected by the first speaker 221 in response to output of the audio signal. For example, the processor 120 may be in a state of providing an output signal (e.g., the first output signal of the second output signal) to the plurality of speakers (e.g., the first speaker 221 or the second speaker 222), and may be in a state of outputting the audio signal (e.g., the first audio signal through the first speaker 221 or the second audio signal through the second speaker 222) through the plurality of speakers. The processor 120 may provide the first output signal to the first speaker 221, and may output the first audio signal through the first speaker 221. According to an embodiment, when outputting the first audio signal through the first speaker 221, the processor 120 may output a first AMP signal (e.g., an amplifier (AMP) pilot tone signal, a sine signal of about 20 Hz or less) along with the first audio signal, or may independently output only the first AMP signal. For example, the first AMP signal may include a signal for measuring the temperature of the first speaker 221.

According to an embodiment, a band-pass filter 230 may be disposed between an audio circuit (e.g., the audio circuit 201 of FIG. 2) and the second speaker 222, and may process only a signal based on a specific frequency band (e.g., a high-sound frequency band, a frequency band corresponding to the second speaker 222). For example, the first AMP signal (e.g., the sine signal of about 20 Hz or less) may be blocked from being supplied to the second speaker 222 due to the band-pass filter 230. According to an embodiment, the processor 120 may play the first audio signal and the first AMP signal through the first speaker 221 in response to provision of the first output signal to the first speaker 221, and may obtain the signal (e.g., a reflected AMP signal) reflected by the first speaker 221. Here, the first AMP signal is not transmitted to the second speaker 222 due to the band-pass filter 230. The reflected AMP signal may include a signal into which the first AMP signal is at least partly reflected based on the first speaker 221.

In operation 313, the processor 120 may identify the first temperature of the first speaker 221, based on the obtained signal (e.g., the signal into which the first AMP signal is reflected (e.g., the reflected AMP signal)). For example, the processor 120 may identify a current value (I) and a voltage value (V), based on the obtained reflected AMP signal, and may calculate a resistance value (R), based on the identified current value (I) and voltage value (V). The processor 120 may calculate the temperature of the first speaker 221, based on the calculated resistance value (R). According to an embodiment, the electronic device 101 may identify the first temperature of the first speaker 221, based on the signal reflected by the first speaker 221. According to an embodiment, the processor 120 may identify the first temperature of the first speaker 221 and determine the first output signal supplied to the first speaker 221, at least partly based on the first output control method (e.g., the first output control method 211 of FIG. 2, a temperature calculation method based on a current value (I) and a voltage value (V) obtained based on a signal (e.g., a reflected AMP signal) reflected by a speaker).

In operation 315, the processor 120 may identify the second temperature of the second speaker 222, based on an output signal (e.g., the second output signal) supplied to the second speaker 222. For example, the processor 120 may supply a configured voltage (e.g., the second output signal) to the second speaker 222 through the audio circuit 201, based on the frequency band (e.g., the high-sound frequency band) corresponding to the second speaker 222. The processor 120 may predict the second temperature of the second speaker 222, based on the voltage supplied to the second speaker 222. For example, the processor 120 may predict the second temperature of the second speaker 222, based on a feedforward method (e.g., a method of predicting a temperature of a speaker to which an input signal is supplied by analyzing a level of the input signal). According to an embodiment, the processor 120 may identify the second temperature of the second speaker 222 and determine the second output signal supplied to the second speaker 222, at least partly based on the second output control method (e.g., the second output control method 212 of FIG. 2, a temperature prediction method based on an input signal). The electronic device 101 may identify the second temperature of the second speaker 222, based on the second output signal (e.g., the configured voltage) supplied to the second speaker 222.

In operation 317, the processor 120 may adjust a voltage (e.g., power, the first output signal, or the second output signal) supplied to at least one of the first speaker 221 and the second speaker 222, based on the first temperature of the first speaker 221 and the second temperature of the second speaker 222. For example, a memory (e.g., the memory 130 of FIG. 1 and FIG. 2) may store a first threshold value (e.g., a first threshold temperature) configured corresponding to the first speaker 221 and a second threshold value (e.g., a second threshold temperature) configured corresponding to the second speaker 222. For example, when the first temperature exceeds the first threshold value, the processor 120 may adjust a voltage supplied to the first speaker 221 to be reduced. The processor 120 may reduce the voltage supplied to the first speaker 221, thereby reducing the first temperature of the first speaker 221. For example, when the second temperature exceeds the second threshold value, the processor 120 may adjust the voltage supplied to the second speaker 222 to be reduced. The processor 120 may reduce the voltage supplied to the second speaker 222, thereby reducing the second temperature of the second speaker 222. According to an embodiment, the processor 120 may configure the first output signal supplied to the first speaker 221 so that the first temperature of the first speaker 221 is not increased to the first threshold value (e.g., a first specified temperature) or higher. According to an embodiment, the processor 120 may configure the second output signal supplied to the second speaker 222 so that the second temperature of the second speaker 222 is not increased to the second threshold value (e.g., a second specified temperature) or higher.

According to an embodiment, the electronic device 101 may identify a temperature of each of the plurality of speakers (e.g., the first speaker 221 or the second speaker 222) using the audio circuit 201 including one amplifier (e.g., the amplifier 213 of FIG. 2). The electronic device 101 may separately adjust a voltage supplied to each speaker to prevent and/or reduce each speaker from being damaged by a temperature change. For example, the electronic device 101 may determine the first output signal supplied to the first speaker 221, at least partly based on the first output control method 211. For example, the electronic device 101 may determine the second output signal supplied to the second speaker 222, at least partly based on the second output control method 212.

According to an embodiment, the first output signal may be determined under a condition that the first speaker 221 is not overheated to the first specified temperature (e.g., the first threshold value or the first threshold temperature) or higher while the first audio signal is output through the first speaker 221 according to the first output signal. For example, when the first specified temperature is about 25 degrees, the processor 120 may determine or revise the first output signal supplied to the first speaker 221 so that the first speaker 221 is not heated to the first specified temperature (e.g., about 25 degrees) or higher. The processor 120 may determine the first output signal supplied to the first speaker 221 so that the first speaker 221 maintains the temperature below the first specified temperature. For example, the first speaker 221 may be configured to output the first audio signal, at least partly based on the first output signal.

According to an embodiment, the second output signal may be determined under a condition that the second speaker 222 is not overheated to the second specified temperature (e.g., the second threshold value or the second threshold temperature) or higher while the second audio signal is output through the second speaker 222 according to the second output signal. For example, when the second specified temperature is about 30 degrees, the processor 120 may determine or revise the second output signal supplied to the second speaker 222 so that the second speaker 222 is not heated to the second specified temperature (e.g., about 30 degrees) or higher. The processor 120 may determine the second output signal supplied to the second speaker 222 so that the second speaker 222 maintains the temperature below the second specified temperature. For example, the second speaker 222 may be configured to output the second audio signal, at least partly based on the second output signal.

Figure 4:
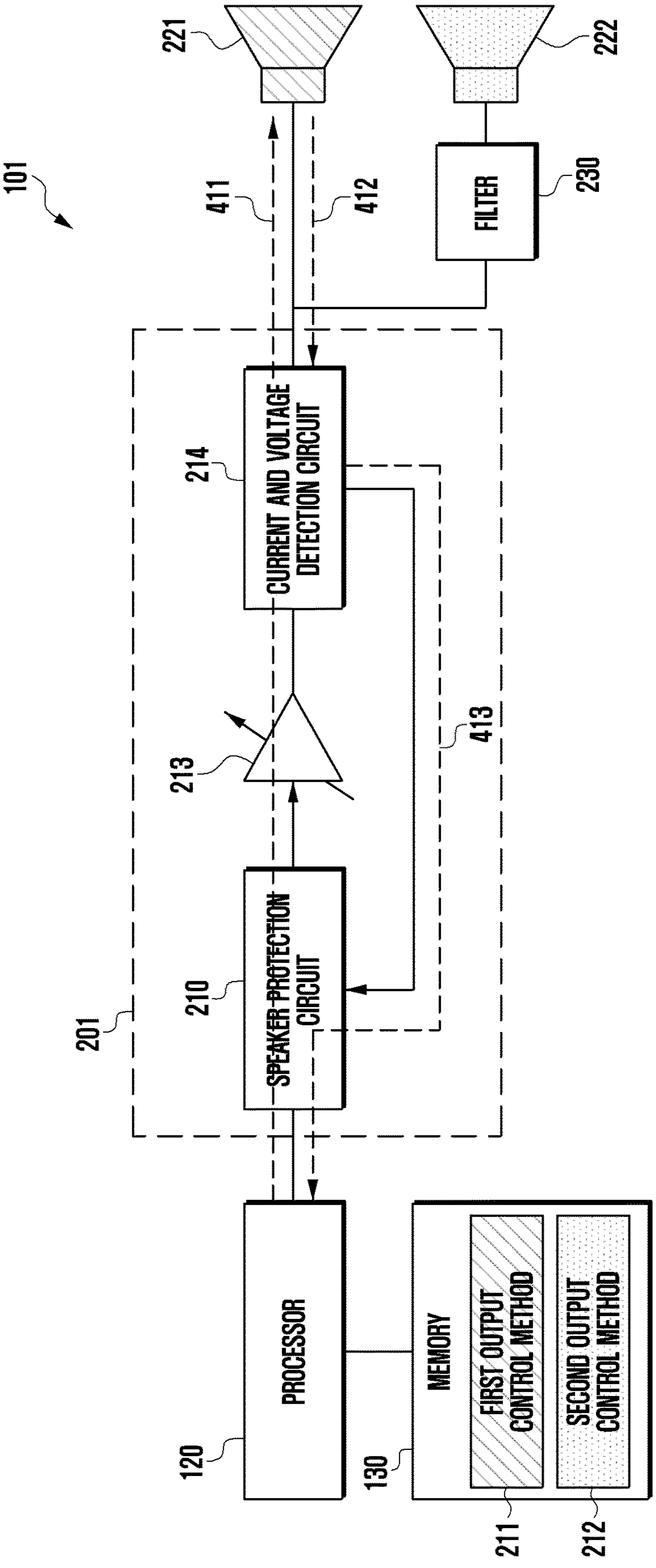
FIG. 4 is an example diagram illustrating a traveling path of a signal and a voltage when using the first method according to various embodiments.

FIG. 4 is a first example diagram illustrating a traveling path of a signal and a voltage when using the first method according to various embodiments.

An electronic device 101 of FIG. 4 may be at least partly similar to the electronic device 101 of FIG. 1 and FIG. 2, or may further include various embodiments of an electronic device. FIG. 4 illustrates a traveling path of a signal supplied to a plurality of speakers (e.g., a first speaker 221 or a second speaker 222), based on the block diagram of FIG. 2.

Referring to FIG. 4, a processor (e.g., the processor 120 of FIG. 1 and FIG. 2) of the electronic device 101 may be in a state of supplying a voltage to the plurality of speakers (e.g., the first speaker 221 or the second speaker 222) and outputting an audio signal. According to an embodiment, the electronic device 101 may determine a first output signal supplied to the first speaker, at least partly based on a first output control method (e.g., the first output control method 211 of FIG. 2, a temperature calculation method based on a current value (I) and a voltage value (V) obtained based on a signal (e.g., a reflected AMP signal) reflected by a speaker). While outputting the audio signal through the first speaker 221, the processor 120 may generate a first AMP signal (e.g., an amplifier (AMP) pilot tone signal, a sine signal of about 20 Hz or less) for measuring a temperature of the first speaker 221, and may supply the first AMP signal to the first speaker 221 according to a (1-1)th path 411. According to an embodiment, the electronic device 101 has a structure in which a band-pass filter 230 is disposed between an audio circuit 201 and the second speaker 222, and the first AMP signal may be prevented or blocked from being transmitted to the second speaker 222 due to the band-pass filter 230. For example, the band-pass filter 230 may pass only a signal based on a specific frequency band (e.g., a high-sound frequency band or a high-frequency band), and may supply only a signal in a high-sound frequency band supported by the second speaker 222 to the second speaker 222. For example, the first AMP signal is a signal of about 20 Hz or less, which is not included in the high-sound frequency band, and may be blocked by the band-pass filter 230.

Referring to FIG. 4, the processor 120 may supply the first AMP signal to the first speaker 221 along the (1-1)th path 411, and may obtain, along a (1-2)th path 412, a signal (e.g., a reflected AMP signal) into which the first AMP signal is reflected by the first speaker 211. For example, the processor 120 may identify a current value (I) and a voltage value (V) corresponding to the obtained reflected AMP signal using a current and voltage detection circuit 214, and may calculate a resistance value (R), based on the current value (I) and the voltage value (V) transmitted along a (1-3)th path 413. The processor 120 may calculate the temperature of the first speaker 221, based on the calculated resistance value (R). The processor 120 may identify a first temperature of the first speaker 221 and determine the first output signal supplied to the first speaker 221, based on the first output control method 211 (e.g., the temperature calculation method based on the current value (I) and the voltage value (V) obtained based on the signal reflected by the speaker) included in a speaker protection circuit 210.

According to an embodiment, the electronic device 101 may identify the first temperature of the first speaker 221, based on the signal (e.g., the reflected AMP signal) reflected by the first speaker 221.

According to an embodiment, the electronic device 101 may determine the first output signal supplied to the first speaker 221 so that the first speaker 221 is not overheated to a first specified temperature (e.g., a first threshold value or a first threshold temperature) or higher while a first audio signal is output through the first speaker 221. For example, the first speaker 221 may output the first audio signal, at least partly based on the first output signal.

Referring to FIG. 4, the processor 120 may identify a second temperature of the second speaker 222, based on an input signal supplied to the second speaker 222. According to an embodiment, the electronic device 101 may determine a second output signal supplied to the second speaker 222, at least partly based on a second output control method (e.g., the second output control method 212 of FIG. 2, a temperature prediction method based on an input signal). For example, the processor 120 may supply a configured voltage (e.g., the second output signal) to the second speaker 222 through the audio circuit 201, based on a frequency band (e.g., a high-sound frequency band) corresponding to the second speaker 222. For example, the processor 120 may supply the configured voltage to the second speaker 222, based on a battery (e.g., the battery 189 of FIG. 1). The processor 120 may determine the voltage (e.g., the second output signal) supplied to the second speaker 222 through the audio circuit 201, and may predict the second temperature of the second speaker 222, based on the determined voltage (e.g., the second output signal). For example, the processor 120 may predict the second temperature of the second speaker 222 and determine the second output signal supplied to the second speaker 222, based on a feedforward method (e.g., the second output control method included in the speaker protection circuit 210, a method of predicting a temperature of a speaker to which an input signal is supplied by analyzing a level of the input signal).

According to an embodiment, the electronic device 101 may identify the second temperature of the second speaker 222, based on the input signal (e.g., a configured voltage) supplied to the second speaker 222.

According to an embodiment, the electronic device 101 may determine the second output signal supplied to the second speaker 222 so that the second speaker 222 is not overheated to a second specified temperature (e.g., a second threshold value or a second threshold temperature) or higher while the second audio signal is output through the second speaker 222. For example, the second speaker 222 may output the second audio signal, at least partly based on the second output signal.

Referring to FIG. 4, the processor 120 may adjust a voltage (e.g., power, the first output signal, or the second output signal) supplied to at least one of the first speaker 221 and the second speaker 222, based on the first temperature and the second temperature. According to an embodiment, the electronic device 101 may identify the temperature of each of the plurality of speakers (e.g., the first speaker 221 or the second speaker 222) using the audio circuit 201 including one amplifier (e.g., the amplifier 213 of FIG. 2). For example, the electronic device 101 may identify the first temperature of the first speaker 221 and determine the first output signal supplied to the first speaker 221 so that the first temperature does not exceed the first threshold value (e.g., the first threshold temperature), based on the first output control method (e.g., the temperature calculation method based on the current value (I) and the voltage value (V) obtained based on the signal reflected by the speaker). In another example, the electronic device 101 may identify (predict) the second temperature of the second speaker 222 and determine the second output signal supplied to the second speaker 222 so that the second temperature does not exceed the second threshold value (e.g., the second threshold temperature), based on the second output control method (e.g., the feedforward method, the method of predicting the temperature of the speaker to which the input signal is supplied by analyzing the level of the input signal).

Figure 5:
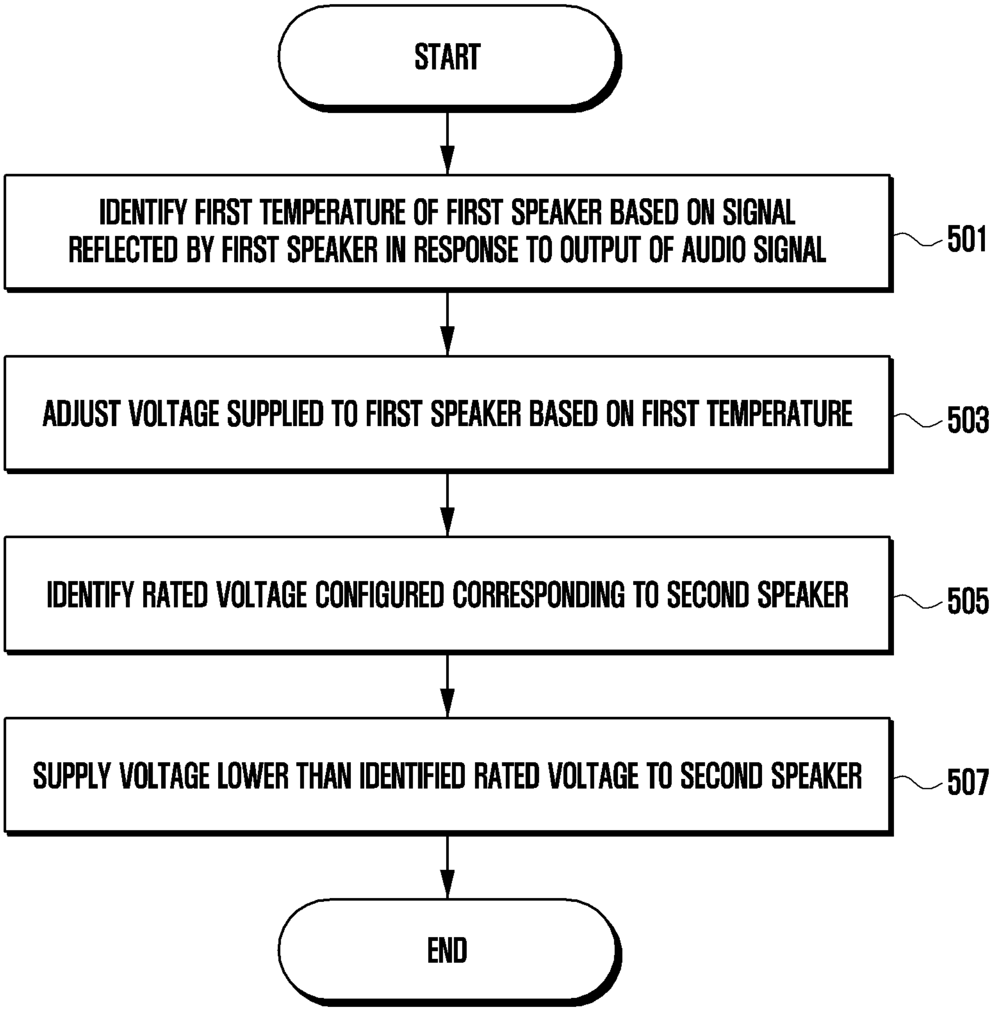
FIG. 5 is a flowchart illustrating a second example method of protecting a speaker according to various embodiments.

FIG. 5 is a flowchart illustrating a second example method of protecting a speaker according to various embodiments.

In the following example embodiments, operations may be sequentially performed, but are not necessarily performed sequentially. For example, the operations may be performed in a different order, or at least two operations may be performed in parallel.

According to an embodiment, operation 501 to operation 507 may be understood as being performed by a processor (e.g., the processor 120 of FIG. 1 and FIG. 2) of an electronic device (e.g., the electronic device 101 of FIG. 1 and FIG. 2).

The electronic device 101 of FIG. 5 may be at least partly similar to the electronic device 101 of FIG. 1 and FIG. 2, or may further include various embodiments of an electronic device. For example, the electronic device 101 may output an audio signal using a plurality of speakers (e.g., the first speaker 221 or the second speaker 222). For example, the plurality of speakers may be in a state of being electrically or operatively connected to one amplifier. The electronic device 101 may identify a first temperature of the first speaker 221 and a second temperature of the second speaker 222 using the one amplifier (e.g., the at least one amplifier 213 of FIG. 2).

In operation 501, the processor 120 of the electronic device 101 may identify the first temperature of the first speaker 221, based on a signal reflected by the first speaker 221, in response to output of an audio signal. Operation 501 may be an integrated operation of operation 301 and operation 303 of FIG. 3. For example, the processor 120 may be in a state of supplying a voltage to the plurality of speakers (e.g., the first speaker 221 or the second speaker 222), and may output the audio signal through the plurality of speakers. The processor 120 may generate a first AMP signal (e.g., an amplifier (AMP) pilot tone signal, a sine signal of about 20 Hz or less) for measuring a temperature of the first speaker 221, and may supply the first AMP signal to the first speaker 221. For example, the first AMP signal may be included in a first output signal for controlling output of the first speaker 221. The processor 120 may supply the first output signal to the first speaker 221, thereby outputting the audio signal through the first speaker 221. For example, a band-pass filter 230 disposed between an audio circuit 201 and the second speaker 222 may pass only a signal based on a specific frequency band (e.g., a high-sound frequency band or a high-frequency band), thus preventing or blocking the first AMP signal from being transmitted to the second speaker 222. According to an embodiment, the processor 120 may supply the first AMP signal to the first speaker 221, and may obtain a signal (e.g., a reflected AMP signal) into which the first AMP signal is reflected by the first speaker 221. For example, the processor 120 may identify a current value (I) and a voltage value (V) corresponding to the obtained reflected AMP signal, based on a current and voltage detection circuit 214, and may calculate a resistance value (R), based on the obtained current value (I) and voltage value (V). The processor 120 may calculate the temperature of the first speaker 221, based on the calculated resistance value (R).

According to an embodiment, the processor 120 may identify the first temperature of the first speaker 221 and determine the first output signal supplied to the first speaker 221, at least partly based on a first output control method (e.g., the first output control method 211 of FIG. 2, a temperature calculation method based on a current value (I) and a voltage value (V) obtained based on a signal reflected by a speaker) included in a speaker protection circuit 210.

In operation 503, the processor 120 may adjust a voltage (e.g., the first output signal) supplied to the first speaker 221, based on the first temperature. For example, a memory (e.g., the memory 130 of FIG. 1 and FIG. 2) may store a first threshold value (e.g., a first threshold temperature) configured corresponding to the first speaker 221. When the first temperature exceeds the first threshold value, the processor 120 may adjust the voltage (e.g., the first output signal) supplied to the first speaker 221 to be reduced. The processor 120 may reduce the voltage (e.g., the first output signal) supplied to the first speaker 221, thereby reducing the first temperature of the first speaker 221. According to an embodiment, the first output signal may be determined under a condition that the first speaker 221 is not overheated to a first specified temperature (e.g., the first threshold value or the first threshold temperature) or higher while a first audio signal is output through the first speaker 221 according to the first output signal.

In operation 505, the processor 120 may identify a rated voltage configured corresponding to the second speaker 222. For example, the memory 130 may store a rated voltage value configured corresponding to the second speaker 222. For example, the rated voltage may be a reference voltage at a level that does not cause a problem in the second speaker 222, based on a frequency band (e.g., a high-sound frequency band) supported by the second speaker 222.

In operation 507, the processor 120 may supply a voltage lower than the identified rated voltage to the second speaker 222. For example, when the voltage lower than the rated voltage is supplied to the second speaker 222, a change in the temperature of the second speaker 222 may be maintained within a certain level or may not occur. When the voltage lower than the rated voltage is supplied to the second speaker 222, a problem that may occur in the second speaker 222 may be minimized/reduced. When supplying the voltage lower than the rated voltage to the second speaker 222, the electronic device 101 may not measure the temperature of the second speaker 222. According to an embodiment, the processor 120 may supply a second output signal to the second speaker 222 under a condition that the second output signal does not exceed the rated voltage value stored in the memory 130.

According to an embodiment, the electronic device 101 may identify the first temperature of the first speaker 221 among the plurality of speakers (e.g. the first speaker 221 or the second speaker 222) using the audio circuit 201 including the one amplifier (e.g., the amplifier 213 of FIG. 2). The electronic device 101 may supply the voltage (e.g., the second output signal) lower than the rated voltage configured corresponding to the second speaker 222 to the second speaker 222, and may not measure the second temperature of the second speaker 222. The electronic device 101 may adjust the voltage supplied to the first speaker 221 so that the first speaker 221 is not damaged due to a temperature change.

According to an embodiment, the electronic device 101 may determine the first output signal supplied to the first speaker 221 so that the first speaker 221 is not overheated to the first specified temperature (e.g., the first threshold value or the first threshold temperature) or higher while the first audio signal is output through the first speaker 221.

Figure 6:
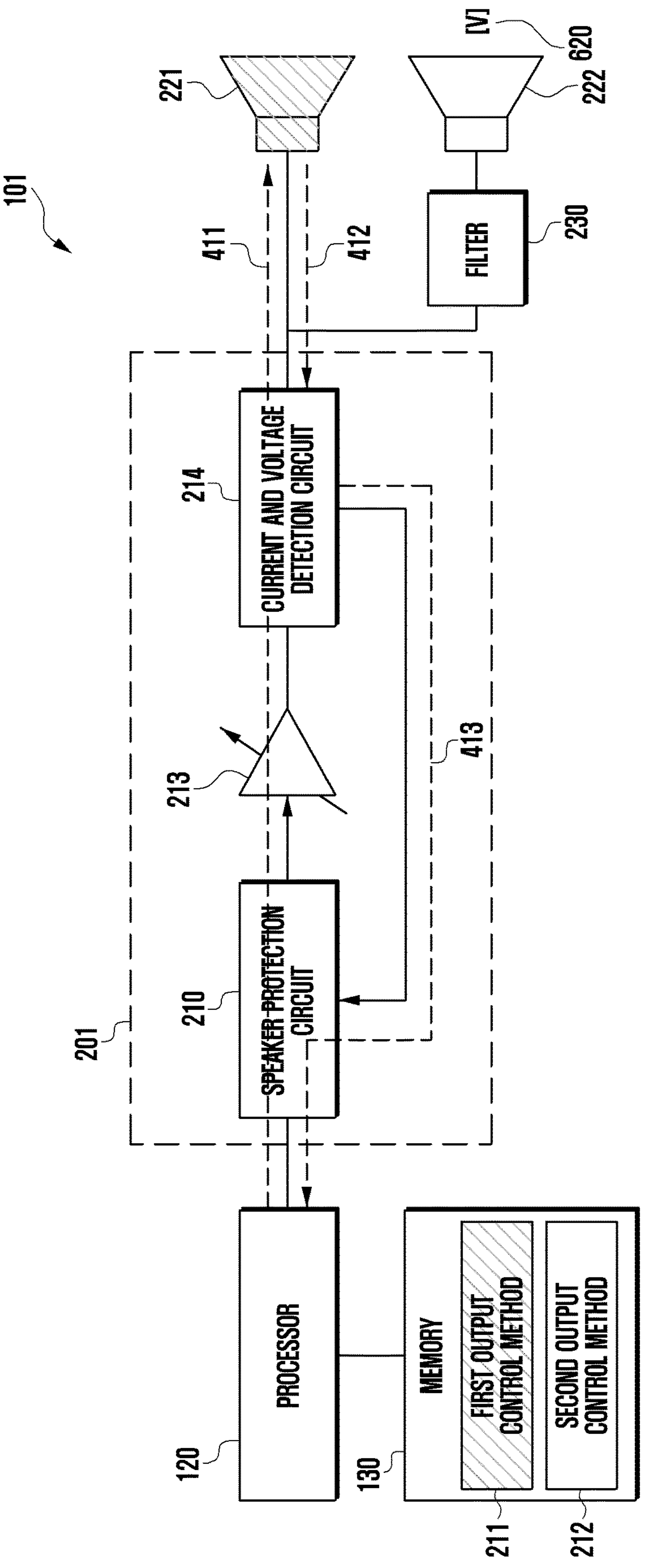
FIG. 6 is an example diagram illustrating a traveling path of a signal and a voltage when using the second method according to various embodiments.

FIG. 6 is a second example diagram illustrating a traveling path of a signal and a voltage when using the second method according to various embodiments.

An electronic device 101 of FIG. 6 may be at least partly similar to the electronic device 101 of FIG. 1 and FIG. 2, or may further include various embodiments of an electronic device. FIG. 6 illustrates a traveling path of a signal supplied to a plurality of speakers (e.g., a first speaker 221 or a second speaker 222), based on the block diagram of FIG. 2.

Referring to FIG. 6, a processor (e.g., the processor 120 of FIGS. 1 and 2) of the electronic device 101 may be in a state of supplying a voltage to the plurality of speakers (e.g., the first speaker 221 or the second speaker 222) and outputting an audio signal. According to an embodiment, the electronic device 101 may determine a first output signal supplied to the first speaker, at least partly based on a first output control method (e.g., the first output control method 211 of FIG. 2, a temperature calculation method based on a current value (I) and a voltage value (V) obtained based on a signal (e.g., a reflected AMP signal) reflected by a speaker). While outputting the audio signal through the first speaker 221, the processor 120 may generate a first AMP signal (e.g., an amplifier (AMP) pilot tone signal, a sine signal of about 20 Hz or less) for measuring a temperature of the first speaker 221, and may supply the first AMP signal to the first speaker 221 according to a (1-1)th path 411. For example, a band-pass filter 230 disposed between an audio circuit 201 and the second speaker 222 may pass only a signal based on a specific frequency band (e.g., a high-sound frequency band or a high-frequency band), thus preventing or blocking the first AMP signal from being transmitted to the second speaker 222.

Referring to FIG. 6, the processor 120 may supply the first AMP signal to the first speaker 221 along the (1-1)th path 411, and may obtain, along a (1-2)th path 412, a signal (e.g., a reflected AMP signal) into which the first AMP signal is reflected by the first speaker 211. For example, the processor 120 may identify a current value (I) and a voltage value (V) corresponding to the obtained reflected AMP signal using a current and voltage detection circuit 214, and may calculate a resistance value (R), based on the current value (I) and the voltage value (V) transmitted along a (1-3)th path 413. The processor 120 may calculate the temperature of the first speaker 221, based on the calculated resistance value (R). The processor 120 may identify a first temperature of the first speaker 221 and determine the first output signal supplied to the first speaker 221, based on the first output control method 211 (e.g., the temperature calculation method based on the current value (I) and the voltage value (V) obtained based on the signal reflected by the speaker) included in a speaker protection circuit 210.

According to an embodiment, the electronic device 101 may determine the first output signal supplied to the first speaker 221 so that the first speaker 221 is not overheated to a first specified temperature (e.g., a first threshold value or a first threshold temperature) or higher while a first audio signal is output through the first speaker 221.

Referring to FIG. 6, the processor 120 may identify a rated voltage [V] 620 configured corresponding to the second speaker 222, and may supply a voltage (e.g., a second output signal) of the identified rated voltage 620 or lower to the second speaker 222. For example, when the voltage of the rated voltage 620 or lower is supplied to the second speaker 222, a change in the temperature of the second speaker 222 may be maintained within a certain level or may not occur. According to an embodiment, when the voltage of the rated voltage 620 or lower is supplied to the second speaker 222, the electronic device 101 may not measure a temperature of the second speaker 222. The electronic device 101 may determine the first output signal supplied to the first speaker 221 without measuring the temperature of the second speaker 222.

Referring to FIG. 6, the electronic device 101 may adjust a voltage (e.g., power or the first output signal) supplied to the first speaker 221, based on the first temperature of the first speaker 221. For example, the electronic device 101 may identify the first temperature of the first speaker 221 and determine the first output signal supplied to the first speaker 221 so that the first temperature does not exceed the first threshold value (e.g., the first threshold temperature), based on the first output control method (e.g., the temperature calculation method based on the current value (I) and the voltage value (V) obtained based on the signal reflected by the speaker). When the voltage of the rated voltage 620 or lower is supplied to the second speaker 222, the electronic device 101 may at least partly stop an operation of measuring the temperature of the second speaker 222. For example, the second output signal supplied to the second speaker 222 may be determined based on the rated voltage 620.

According to an embodiment, the electronic device 101 may predict the first temperature of the first speaker 221 and determine the first output signal supplied to the first speaker 221 so that the predicted first temperature does not exceed the first threshold value (e.g., the first threshold temperature), based on a second output control method (e.g., a temperature prediction method based on an input signal, the second output control method 212). According to an embodiment, the electronic device 101 may identify the rated voltage [V] 620 configured corresponding to the second speaker 222, and may supply the voltage (e.g., the second output signal) of the identified rated voltage 620 or lower to the second speaker 222. When the voltage of the rated voltage 620 or lower is supplied to the second speaker 222, the operation of measuring the temperature of the second speaker 222 may be at least partly omitted. For example, the second output signal supplied to the second speaker 222 may be determined based on the rated voltage 620.

According to an embodiment, the electronic device 101 may identify a rated voltage [V] configured corresponding to the first speaker 221, and may supply a voltage (e.g., the first output signal) of the identified rated voltage or lower to the first speaker 221. When the voltage of the rated voltage or lower is supplied to the first speaker 221, an operation of measuring the temperature of the first speaker 221 may be at least partly omitted. For example, the first output signal supplied to the first speaker 221 may be determined based on the rated voltage. According to an embodiment, the electronic device 101 may predict a second temperature of the second speaker 222 and determine the second output signal supplied to the second speaker 222 so that the predicted second temperature does not exceed a second threshold value (e.g., a second threshold temperature), based on the second output control method (e.g., the temperature prediction method based on the input signal, the second output control method 212).

Figure 7:
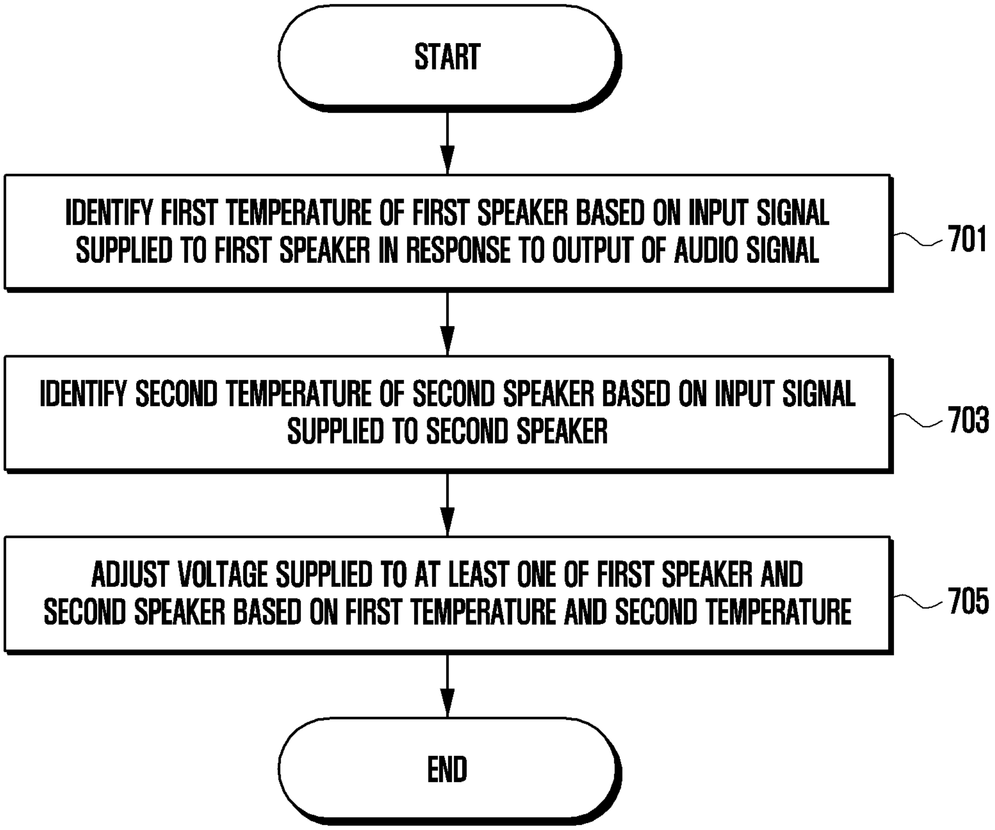
FIG. 7 is a flowchart illustrating a third example method of protecting a speaker according to various embodiments.

FIG. 7 is a flowchart illustrating a third example method of protecting a speaker according to various embodiments.

In the example embodiments, operations may be sequentially performed, but are not necessarily performed sequentially. For example, the operations may be performed in a different order, or at least two operations may be performed in parallel.

According to an embodiment, operation 701 to operation 705 may be understood as being performed by a processor (e.g., the processor 120 of FIG. 1 and FIG. 2) of an electronic device (e.g., the electronic device 101 of FIG. 1 and FIG. 2).

The electronic device 101 of FIG. 7 may be at least partly similar to the electronic device 101 of FIG. 1 and FIG. 2, or may further include various embodiments of an electronic device. For example, the electronic device 101 may output an audio signal using a plurality of speakers (e.g., the first speaker 221 or the second speaker 222). For example, the plurality of speakers may be in a state of being electrically or operatively connected to one amplifier. The electronic device 101 may identify a first temperature of the first speaker 221 and a second temperature of the second speaker 222 using the one amplifier.

In operation 701, the processor 120 of the electronic device 101 may identify the first temperature of the first speaker 221, based on an input signal supplied to the first speaker 221, in response to output of an audio signal. For example, the processor 120 may supply a configured first voltage to the first speaker 221 through an audio circuit (e.g., the audio circuit 201 of FIG. 2), based on a frequency band (e.g., a low-sound frequency band) corresponding to the first speaker 221. In an embodiment, the processor 120 may predict the first temperature of the first speaker 221, based on the first voltage supplied to the first speaker 221. For example, the processor 120 may predict the first temperature of the first speaker 221, based on a feedforward method (e.g., a method of predicting a temperature of a speaker to which an input signal is supplied by analyzing a level of the input signal, the second output control method 212). According to an embodiment, the electronic device 101 may identify (e.g., predict) the first temperature of the first speaker 221, based on the input signal (e.g., the configured first voltage) supplied to the first speaker 221.

In operation 703, the processor 120 may identify the second temperature of the second speaker 222, based on an input signal supplied to the second speaker 222. For example, the processor 120 may supply a configured second voltage to the second speaker 222 through the audio circuit 201 of FIG. 2, based on a frequency band (e.g., a high-sound frequency band) corresponding to the second speaker 222. In an embodiment, the processor 120 may predict the second temperature of the second speaker 222, based on the second voltage supplied to the second speaker 222. For example, the processor 120 may predict the second temperature of the second speaker 222, based on the feedforward method (e.g., the method of predicting the temperature of the speaker to which the input signal is supplied by analyzing the level of the input signal, the second output control method 212). According to an embodiment, the electronic device 101 may identify (e.g., predict) the second temperature of the second speaker 222, based on the input signal (e.g., the configured second voltage) supplied to the second speaker 222.

In operation 705, the processor 120 may adjust a voltage (e.g., a first output signal or a second output signal) supplied to at least one of the first speaker 221 and the second speaker 222, based on the first temperature and the second temperature. For example, a memory (e.g., the memory 130 of FIG. 1 and FIG. 2) may store a first threshold value (e.g., a first threshold temperature) configured corresponding to the first speaker 221 and a second threshold value (e.g., a second threshold temperature) configured corresponding to the second speaker 222. For example, when the first temperature exceeds the first threshold value, the processor 120 may adjust a voltage supplied to the first speaker 221 to be reduced. The processor 120 may reduce the voltage supplied to the first speaker 221, thereby reducing the first temperature of the first speaker 221. For example, when the second temperature exceeds the second threshold value, the processor 120 may adjust a voltage supplied to the second speaker 222 to be reduced. The processor 120 may reduce the voltage supplied to the second speaker 222, thereby reducing the second temperature of the second speaker 222. According to an embodiment, the electronic device 101 may determine the first output signal supplied to the first speaker 221 so that the first speaker 221 is not overheated to a first specified temperature (e.g., the first threshold value or the first threshold temperature) or higher. According to an embodiment, the electronic device 101 may determine the second output signal supplied to the second speaker 222 so that the second speaker 222 is not overheated to a second specified temperature (e.g., the second threshold value or the second threshold temperature) or higher.

According to an embodiment, the electronic device 101 may identify a temperature of each of the plurality of speakers (e.g. the first speaker 221 or the second speaker 222) using the audio circuit 201 including the one amplifier (e.g., the amplifier 213 of FIG. 2). The electronic device 101 may apply the feedforward method (e.g., the method of predicting the temperature of the speaker to which the input signal is supplied by analyzing the level of the input signal, the second output control method 212) to each of the plurality of speakers (e.g., the first speaker 221 or the second speaker 222), and may predict the temperature of each speaker. The electronic device 101 may separately adjust a voltage supplied to each speaker so that each speaker is not damaged due to a temperature change.

Figure 8:
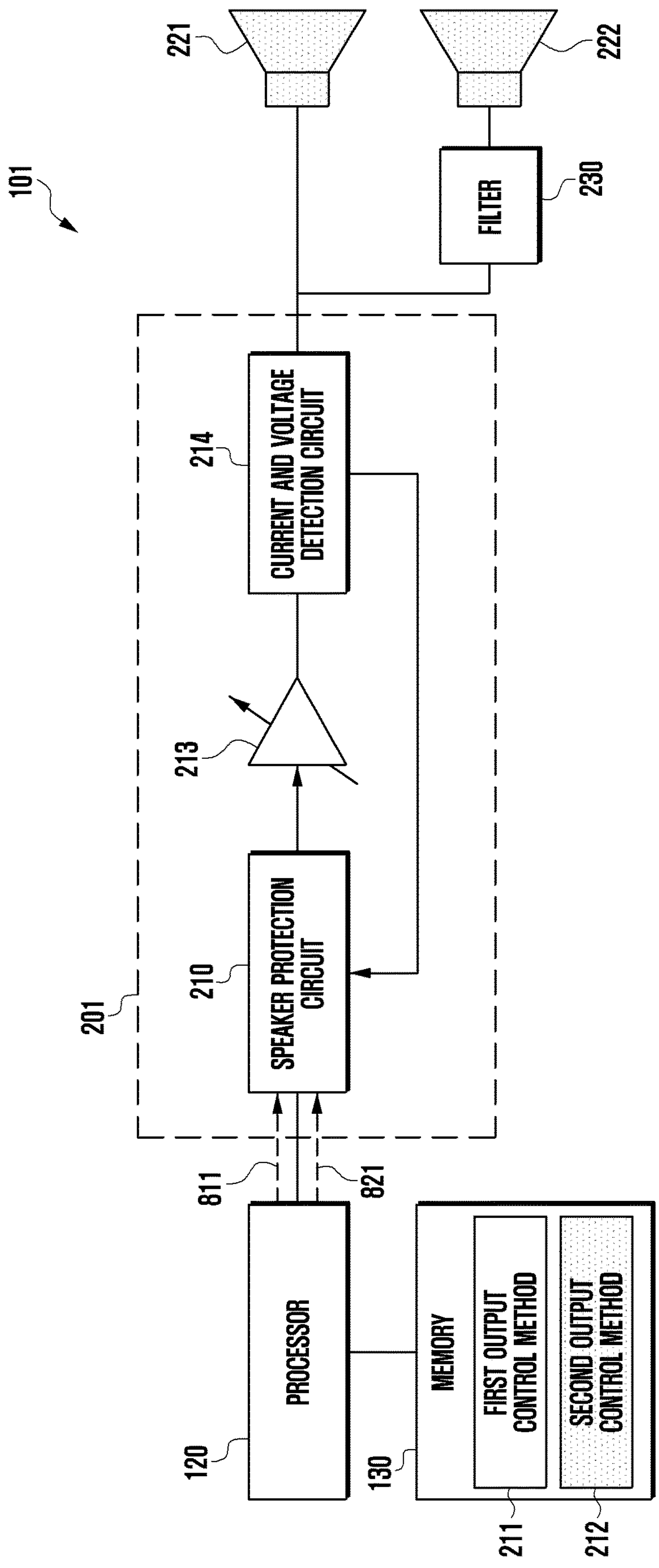
FIG. 8 is an example diagram illustrating a traveling path of a signal and a voltage when using the third method according to various embodiments.

FIG. 8 is a third example diagram illustrating a traveling path of a signal and a voltage when using the third method according to various embodiments.

An electronic device 101 of FIG. 8 may be at least partly similar to the electronic device 101 of FIG. 1 and FIG. 2, or may further include various embodiments of an electronic device. FIG. 8 illustrates a traveling path of a signal supplied to a plurality of speakers (e.g., a first speaker 221 or a second speaker 222), based on the block diagram of FIG. 2.

Referring to FIG. 8, a processor (e.g., the processor 120 of FIGS. 1 and 2) of the electronic device 101 may be in a state of supplying a voltage to the plurality of speakers (e.g., the first speaker 221 or the second speaker 222) and outputting an audio signal. While outputting the audio signal, the processor 120 may identify a temperature of each speaker, based on an input signal supplied to the first speaker 221 and the second speaker 222.

For example, through an audio circuit 201, the processor 120 may supply a configured first voltage to the first speaker 221 along a first path 811, based on a first frequency band (e.g., a low-sound frequency band or a mid-sound frequency band) corresponding to the first speaker 221, and may supply a configured second voltage to the second speaker 222 along a second path 821, based on a second frequency band (e.g., a high-sound frequency band). The processor 120 may predict a first temperature of the first speaker 211, based on the first voltage supplied to the first speaker 221 along the first path 811. The processor 120 may predict a second temperature of the second speaker 222, based on the second voltage supplied to the second speaker 222 along the second path 821.

According to an embodiment, a speaker protection circuit 210 of FIG. 8 may be omitted, in which case the process 120 may serve a role of the speaker protection circuit 210. For example, the processor 120 may independently predict the first temperature of the first speaker 221, based on the first voltage supplied to the first speaker 221, or predict the second temperature of the second speaker 222, based on the second voltage supplied to the second speaker 222.

According to an embodiment, the electronic device 101 may separately predict the first temperature of the first speaker 221 and the second temperature of the second speaker 222, based on a second output control method (e.g., a feedforward method, a method of predicting a temperature of a speaker to which an input signal is supplied by analyzing a level of the input signal, the second output control method 212).

According to an embodiment, in a situation where a first output control method (e.g., a temperature calculation method based on a current value (I) and a voltage value (V) obtained based on a signal reflected by a speaker) is applied to the first speaker 221, when the electronic device 101 further includes a third speaker (e.g., an additional speaker or a sub-speaker), a band-pass filter (e.g., the band-pass filter 230 of FIG. 2) may be disposed between at least one amplifier 213 and the third speaker.

According to an embodiment, in a situation where the first output control method (e.g., the temperature calculation method based on the current value (I) and the voltage value (V) obtained based on the signal reflected by the speaker) is applied to the first speaker 221, when the electronic device 101 further includes the third speaker (e.g., the additional speaker or the sub-speaker), the band-pass filter (e.g., the band-pass filter 230 of FIG. 2) may not be disposed between the at least one amplifier 213 and the third speaker. For example, when the electronic device 101 identifies the temperature of each speaker only by the second output control method (e.g., the feedfoward method, the method of predicting the temperature of the speaker to which the input signal is supplied by analyzing the level of the input signal, the second output control method 212), the band-pass filter 230 may not be disposed between the at least one amplifier 213 and the third speaker.

Figure 9A:
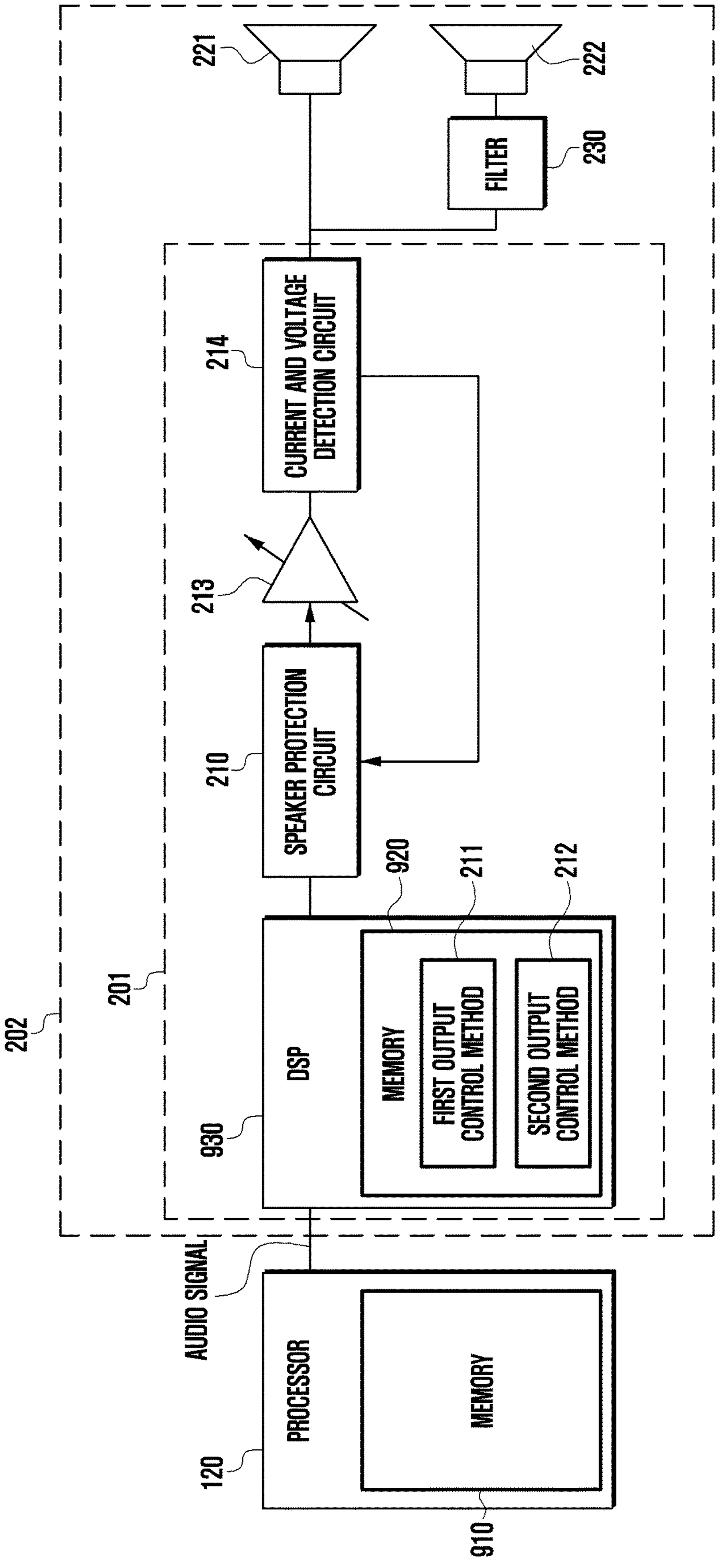
FIG. 9A is a first example circuit diagram showing that a chip to which a first output control method and a second output control method are applied is included in an audio circuit according to various embodiments.
Figure 9B:
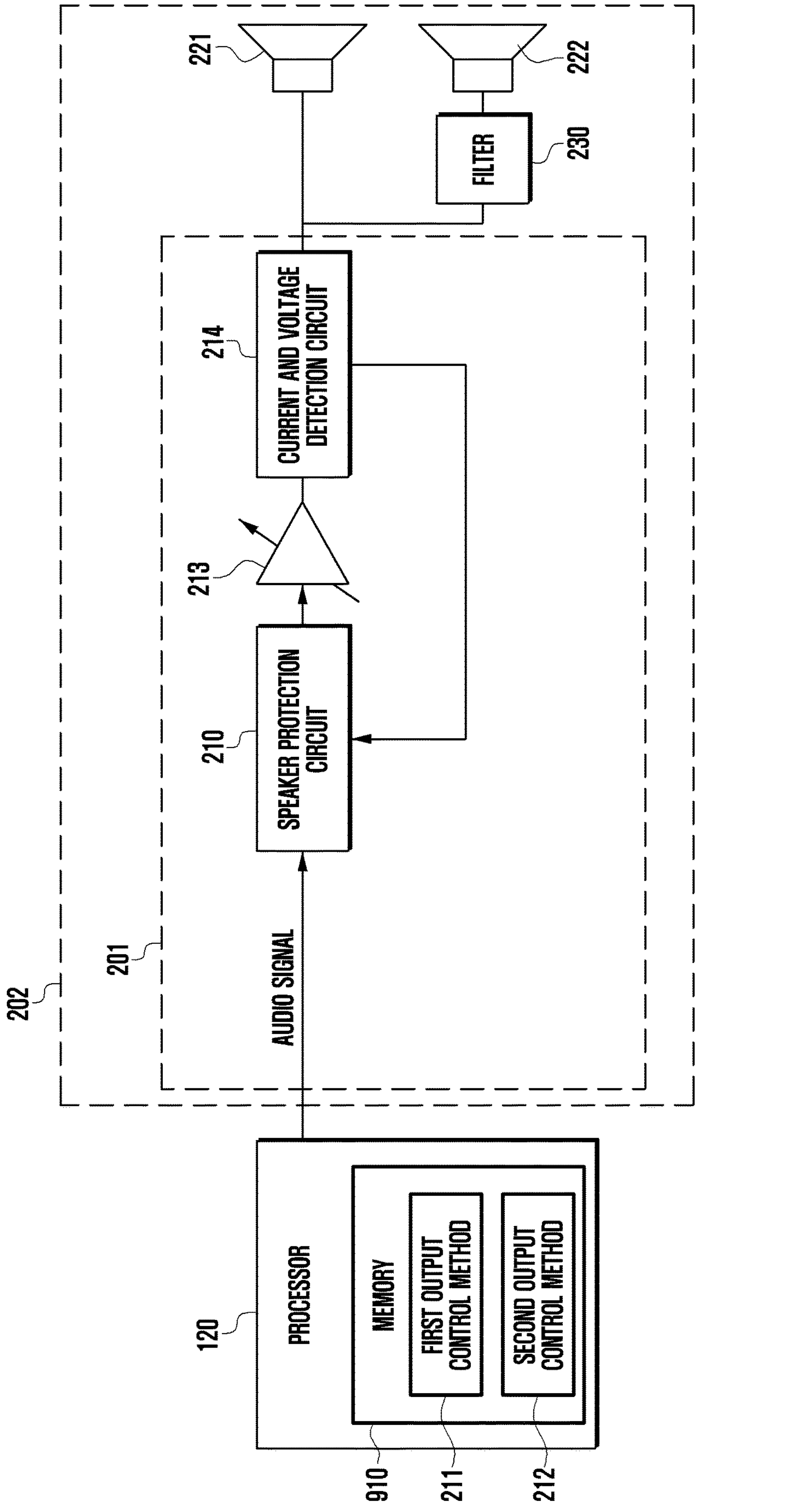
FIG. 9B is a second example circuit diagram showing that a first output control method and a second output control method are stored in an external storage space of an audio circuit according to various embodiments.
Figure 9C:
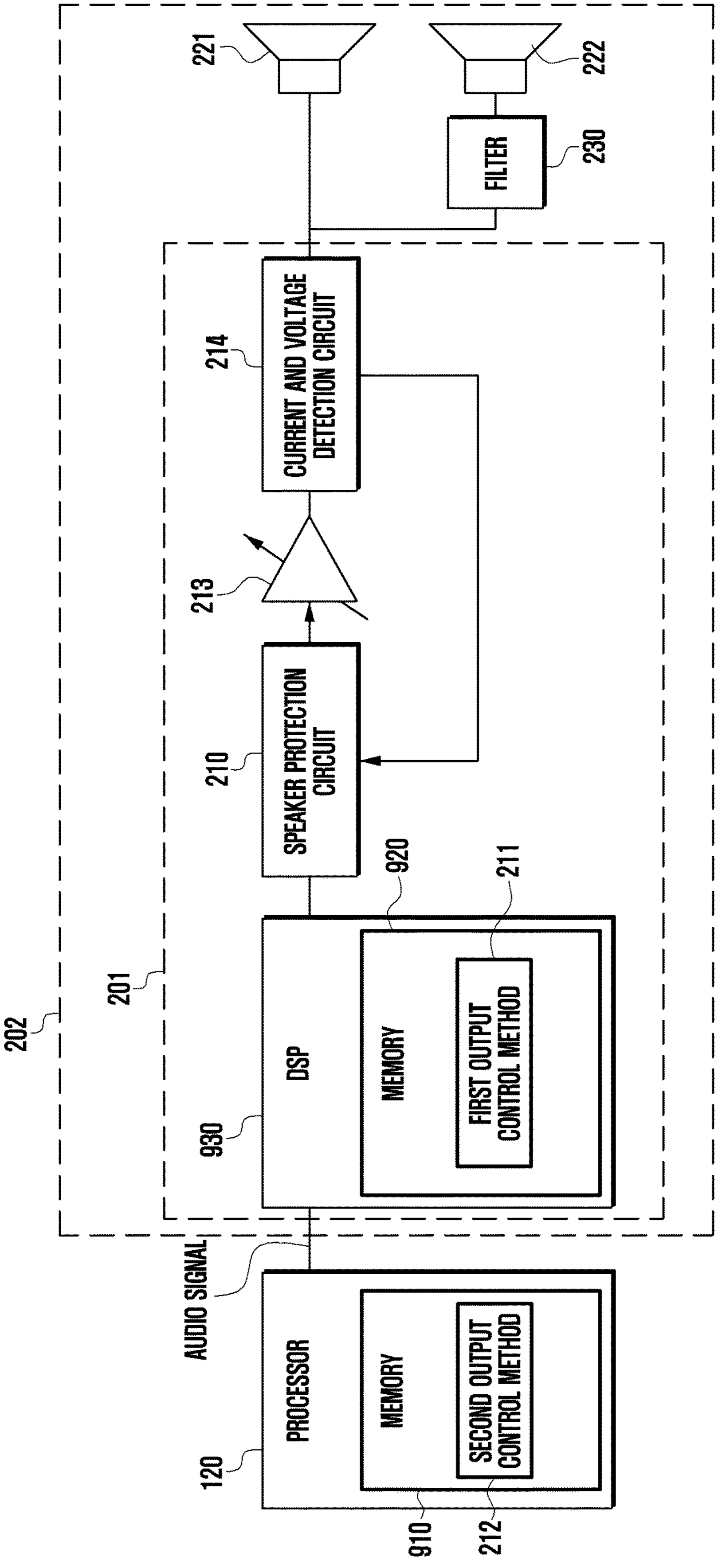
FIG. 9C is a third example circuit diagram showing that a chip to which only a first output control method is applied is included in an audio circuit according to various embodiments.

FIG. 9A is a first example circuit diagram showing that a chip to which a first output control method and a second output control method are applied is included in an audio circuit according to various embodiments. FIG. 9B is a second example circuit diagram showing that a first output control method and a second output control method are stored in an external storage space of an audio circuit according to various embodiments. FIG. 9C is a third example circuit diagram showing that a chip to which only a first output control method is applied is included in an audio circuit according to various embodiments.

An electronic device 101 of FIG. 9A, FIG. 9B, and FIG. 9C may be at least partly similar to the electronic device 101 of FIG. 1 and FIG. 2, or may further include various embodiments of an electronic device.

Referring to FIG. 9A, FIG. 9B, and FIG. 9C, a processor (e.g., the processor 120 of FIG. 1 and FIG. 2) of the electronic device 101 may be in a state of supplying a voltage to the plurality of speakers (e.g., the first speaker 221 or the second speaker 222) and outputting an audio signal. While outputting the audio signal, the processor 120 may identify a temperature of each speaker, based on an input signal (e.g., an AMP signal) supplied to the first speaker 221 and the second speaker 222.

Referring to FIG. 9A, the electronic device 101 may include a digital signal processor (DSP) (e.g., including digital signal processing circuitry) 930 to which a first output control method 211 and a second output control method 212 are applied in an audio circuit 201. For example, the first output control method 211 and a second output control method 212 may be stored in a storage area (e.g., memory 920) included in the DSP 930. According to an embodiment, the processor 120 of the electronic device 101 may determine a first output signal supplied to the first speaker 221, based on the first output control method 211 applied to the DSP 930. The processor 120 may determine a second output signal supplied to the second speaker 222, based on the second output control method 212 applied to the DSP 930.

Referring to FIG. 9B, the electronic device 101 may store a first output control method 211 and a second output control method 212 in an external storage space (e.g., a memory 910 of the process 120) of an audio circuit 201. According to an embodiment, the processor 120 may determine a first output signal supplied to the first speaker 221, based on the first output control method 211 of the memory 910, and may determine a second output signal supplied to the second speaker 222, based on the second output control method 212 of the memory 910.

Referring to FIG. 9C, the electronic device 101 may include a digital signal processor (DSP) 930 to which a first output control method 211 is applied in an audio circuit 201, and a second output control method 212 may be stored in an external storage space (e.g., a memory 910) of the audio circuit 201. For example, the first output control method 211 may be stored in a storage area (e.g., memory 920) included in the DSP 930. According to an embodiment, the processor 120 of the electronic device 101 may determine a first output signal supplied to the first speaker 221, based on the first output control method 211 applied to the DSP 930. The processor 120 may determine a second output signal supplied to the second speaker 222, based on the second output control method 212 of the memory 910. According to an embodiment, the first output control method 211 and the second output control method 212 are not limited to being stored in a specific storage space. The first output control method 211 and the second output control method 212 may be stored in various storage spaces depending on the design and configuration of the electronic device 101.

An operating method of an electronic device according to an example embodiment may include: determining a first output signal for at least one amplifier included in the electronic device, at least partly based on a first output control method using a processor included in the electronic device, outputting a first audio signal corresponding to a first frequency band, at least partly based on the first output signal, using a first speaker connected to the at least one amplifier, determining a second output signal for the at least one amplifier, at least partly based on a second output control method, using the processor, and outputting a second audio signal corresponding to a second frequency band at least partly different from the first frequency band, at least partly based on the second output signal, using a second speaker connected to the at least one amplifier.

According to an example embodiment, the determining of the first output signal may include determining the first output signal so that the first speaker is not overheated to a first specified temperature or higher based on the first audio signal being output through the first speaker according to the first output signal, and According to an example embodiment, the determining of the second output signal may include determining the second output signal so that the second speaker is not overheated to a second specified temperature or higher based on the second audio signal being output through the second speaker according to the second output signal.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. It is intended that features described with respect to separate embodiments, or features recited in separate claims, may be combined unless such a combination is explicitly specified as being excluded or such features are incompatible. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

a first speaker configured to output a first audio signal corresponding to a first frequency band;

a second speaker configured to output a second audio signal corresponding to a second frequency band at least partly different from the first frequency band;

at least one amplifier configured to provide a first output signal for controlling output of the first speaker and a second output signal for controlling output of the second speaker; and at least one processor, comprising processing circuitry, operatively connected to the at least one amplifier, wherein at least one processor, individually and/or collectively, is configured to:

determine the first output signal, at least partly based on a first output control method;

output the first audio signal, at least partly based on the first output signal, using the first speaker connected to the at least one amplifier;

determine the second output signal, at least partly based on a second output control method; and output the second audio signal, at least partly based on the second output signal, using the second speaker connected to the at least one amplifier.

2. The electronic device of claim 1, wherein at least one processor, individually and/or collectively, is configured to:

determine the first output signal so that the first speaker is not overheated to a first specified temperature or higher based on the first audio signal being output through the first speaker according to the first output signal; and determine the second output signal so that the second speaker is not overheated to a second specified temperature or higher based on the second audio signal being output through the second speaker according to the second output signal.

3. The electronic device of claim 1, wherein at least one processor, individually and/or collectively, is configured to use one of a plurality of output control methods comprising at least two or more of a voltage or current-based method, an audio signal-based method, or a rated voltage-based method as the first output control method and another of the plurality of output control methods as the second output control method.

4. The electronic device of claim 3, wherein at least one processor, individually and/or collectively, is configured to:

determine the first output signal, at least partly based on a voltage or a current of the first speaker obtained based on audio being output through the first speaker according to the voltage or current-based method; and determine the second output signal, at least partly based on a characteristic of a signal corresponding to audio content to be output through the second speaker according to the audio signal-based method.

5. The electronic device of claim 4, wherein at least one processor, individually and/or collectively, is configured to obtain the voltage or the current, at least partly based on a signal provided from the at least one amplifier and reflected by the first speaker, and wherein the electronic device further comprises a band-pass filter disposed between the at least one amplifier and the second speaker.

6. The electronic device of claim 5, wherein the second output control method includes protecting the second speaker so that the second speaker is not overheated to a second specified temperature or higher, based on the second output signal supplied to the second speaker.

7. The electronic device of claim 5, wherein the second output control method includes supplying a voltage lower than a rated voltage of the second speaker to the second speaker.

8. The electronic device of claim 5, further comprising:

a third speaker operatively connected to the at least one amplifier and configured to output an audio signal based on a third frequency band; and a band-pass filter disposed between the at least one amplifier and the third speaker.

9. The electronic device of claim 3, wherein the first output control method includes protecting the first speaker so that first second speaker is not overheated to a first specified temperature or higher, based on the first output signal supplied to the first speaker, and wherein the second output control method includes supplying a voltage lower than a rated voltage of the second speaker to the second speaker.

10. The electronic device of claim 9, further comprising a third speaker operatively connected to the at least one amplifier and configured to output an audio signal based on a third frequency band, wherein no band-pass filter is disposed between the at least one amplifier and the third speaker.

11. The electronic device of claim 3, wherein the first output control method includes supplying a voltage lower than a rated voltage of the first speaker to the first speaker, and wherein the second output control method includes protecting the second speaker so that the second speaker is not overheated to a second specified temperature or higher, based on the second output signal supplied to the second speaker.

12. The electronic device of claim 3, wherein the voltage or current-based method includes predicting a temperature of the first speaker, based on a signal reflected by the first speaker.

13. The electronic device of claim 3, wherein the audio signal-based method includes predicting a temperature of the second speaker, based on an input signal supplied to the second speaker.

14. The electronic device of claim 1, wherein the first output control method and the second output control method include audio signal-based methods.

15. The electronic device of claim 1, further comprising:

a speaker protection circuit operatively connected to the at least one amplifier, wherein at least one processor, individually and/or collectively, is configured to:

determine, by the speaker protection circuit, the first output signal at least partly based on the first output control method;

output the first audio signal at least partly based on the first output signal using the first speaker connected to the at least one amplifier;

determine the second output signal at least partly based on the second output control method different from the first output control method; and output the second audio signal at least partly based on the second output signal, using the second speaker connected to the at least one amplifier.

16. A method of operating an electronic device, the method comprising:

determining a first output signal for at least one amplifier included in the electronic device, at least partly based on a first output control method, using at least one processor included in the electronic device;

outputting a first audio signal corresponding to a first frequency band, at least partly based on the first output signal, using a first speaker connected to the at least one amplifier;

determining a second output signal for the at least one amplifier, at least partly based on a second output control method, using at least one processor; and outputting a second audio signal corresponding to a second frequency band at least partly different from the first frequency band, at least partly based on the second output signal, using a second speaker connected to the at least one amplifier.

17. The method of claim 16, wherein the determining of the first output signal comprises determining the first output signal so that the first speaker is not overheated to a first specified temperature or higher based on the first audio signal being output through the first speaker according to the first output signal, and wherein the determining of the second output signal comprises determining the second output signal so that the second speaker is not overheated to a second specified temperature or higher based on the second audio signal being output through the second speaker according to the second output signal.

18. The method of claim 16, wherein the first output control method comprises one of a plurality of output control methods comprising at least two or more of a voltage or current-based method, an audio signal-based method, or a rated voltage-based method, and wherein the second output control method comprises another of the plurality of output control methods.

19. The method of claim 18, further comprising:

determining the first output signal, at least partly based on a voltage or a current of the first speaker obtained based on audio being output through the first speaker according to the voltage or current-based method, and determine the second output signal, at least partly based on a characteristic of a signal corresponding to audio content to be output through the second speaker according to the audio signal-based method.

20. One or more non-transitory computer-readable storage media storing one or more computer programs including computer-executable instructions that, when executed by one or more processors of an electronic device, cause the electronic device to perform operations, the operations comprising:

determining a first output signal for at least one amplifier included in the electronic device, at least partly based on a first output control method, using at least one processor included in the electronic device;

outputting a first audio signal corresponding to a first frequency band, at least partly based on the first output signal, using a first speaker connected to the at least one amplifier;

determining a second output signal for the at least one amplifier, at least partly based on a second output control method, using at least one processor; and outputting a second audio signal corresponding to a second frequency band at least partly different from the first frequency band, at least partly based on the second output signal, using a second speaker connected to the at least one amplifier.

* * * * *